(12) United States Patent
Nakagawa

(10) Patent No.: US 8,101,988 B2
(45) Date of Patent: Jan. 24, 2012

(54) NONVOLATILE SEMICONDUCTOR MEMORY DEVICE

(75) Inventor: Kenichiro Nakagawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 167 days.

(21) Appl. No.: 12/458,339

(22) Filed: Jul. 8, 2009

(65) Prior Publication Data
US 2010/0006914 A1   Jan. 14, 2010

(30) Foreign Application Priority Data

Jul. 14, 2008   (JP) .................................. 2008-182564

(51) Int. Cl.
*H01L 29/788* (2006.01)
(52) U.S. Cl. ................ 257/314; 257/E29.131; 257/315
(58) Field of Classification Search .................. 257/314, 257/E29.131, 315
See application file for complete search history.

(56) References Cited

U.S. PATENT DOCUMENTS

| | | | |
|---|---|---|---|
| 5,998,263 A * | 12/1999 | Sekariapuram et al. | 438/259 |
| 7,838,922 B2 * | 11/2010 | Li et al. | 257/319 |
| 2003/0122185 A1 | 7/2003 | Wang et al. | |
| 2004/0212009 A1 | 10/2004 | Wang et al. | |
| 2004/0214396 A1 | 10/2004 | Wang et al. | |
| 2006/0228880 A1 * | 10/2006 | McDaniel et al. | 438/625 |

FOREIGN PATENT DOCUMENTS

JP   2003-234422   8/2003

* cited by examiner

*Primary Examiner* — Jerome Jackson. Jr.
*Assistant Examiner* — Paul Budd
(74) *Attorney, Agent, or Firm* — McGinn IP Law Group, PLLC

(57) ABSTRACT

A nonvolatile semiconductor memory device includes a semiconductor substrate that includes a trench, a charge storage layer that is formed inside of the trench, a first gate that is formed above a side surface and a bottom surface of the trench, a second gate that is formed beside the first gate, and that is formed above the charge storage layer, a first diffusion region that is formed on the semiconductor substrate inside of the trench, and a second diffusion region that is formed on the semiconductor substrate outside of the trench.

13 Claims, 30 Drawing Sheets

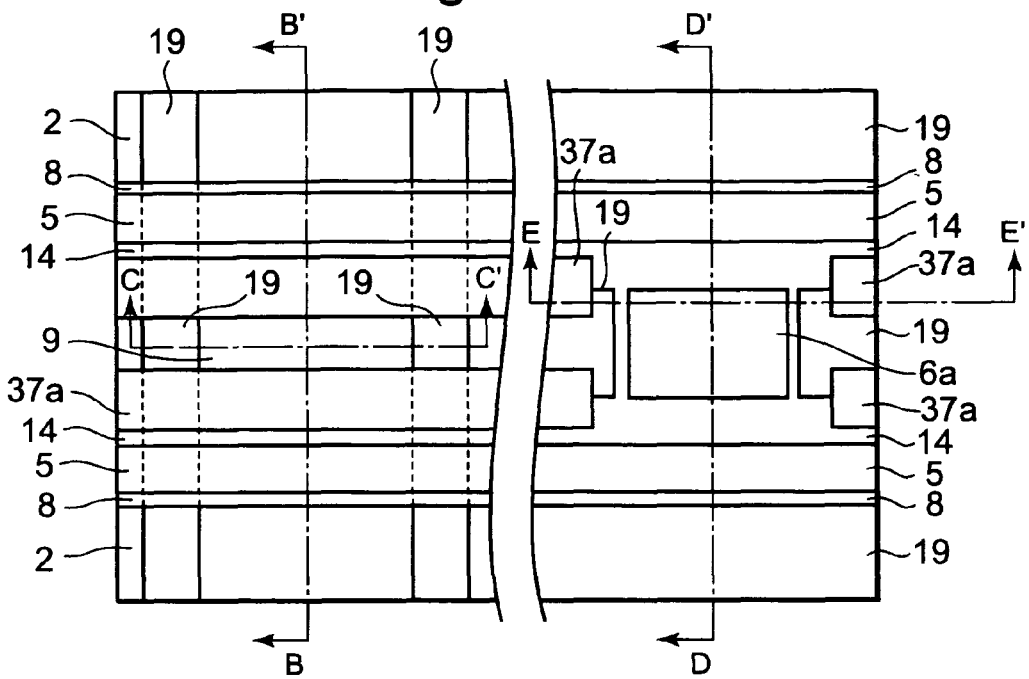
Fig. 33A
Fig. 33B
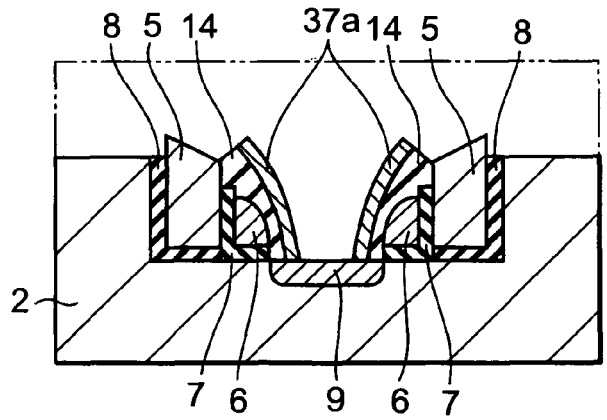
Fig. 33C
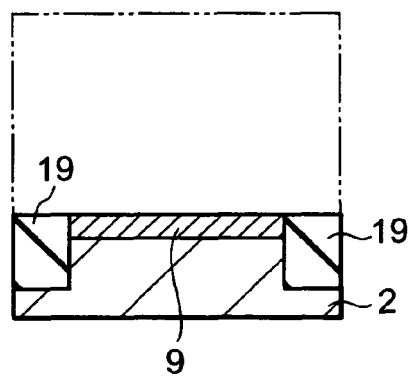
Fig. 33D
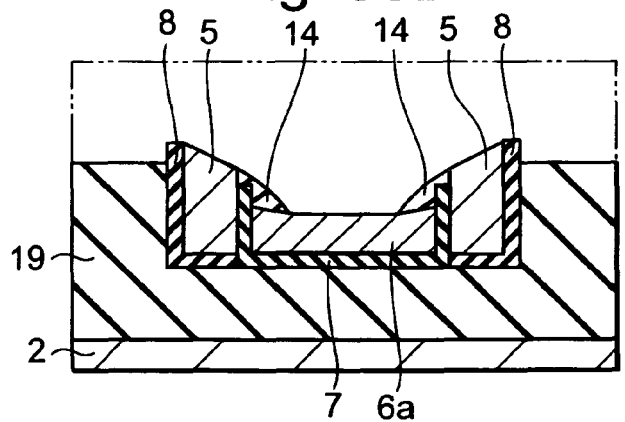
Fig. 33E
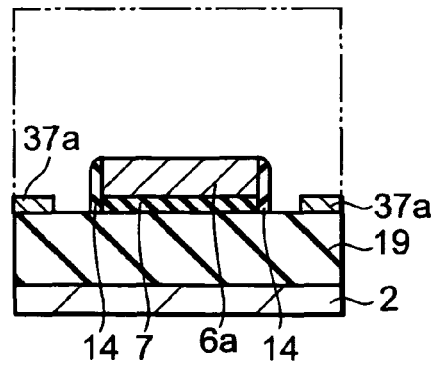

NONVOLATILE SEMICONDUCTOR MEMORY DEVICE

INCORPORATION BY REFERENCE

This application is based upon and claims the benefit of priority from Japanese Patent Application No. 2008-182564 which was filed on Jul. 14, 2008, the disclosure of which is incorporated herein in its entirety by reference.

BACKGROUND OF THE INVENTION

1. Field of the Invention

The present invention relates to a nonvolatile semiconductor memory device, and to a method for manufacturing the nonvolatile semiconductor memory device.

2. Description of Related Art

A highly-integrated nonvolatile semiconductor memory device has been demanded with higher function and performance of an information processing device. A technique of miniaturizing memory elements that configure the nonvolatile semiconductor memory device has been known as an example of a technique for enhancing the integration degree of the nonvolatile semiconductor memory device (for example, refer to JP-A-2003-234422).

JP-A-2003-234422 discloses a technique by which a nonvolatile memory device is formed through a self-aligning method. JP-A-2003-234422 discloses a technique pertaining to a nonvolatile floating gate memory cell array which is remarkably reduced in cell size without adversely compromising the erase/couple ratio of the memory cells. In JP-A-2003-234422, each of the memory cells disposed in the semiconductor device includes a trench formed on the surface of a semiconductor substrate, and source and drain regions apart from each other. A channel region is formed between the source and drain regions. The drain region is formed below the trench. The conductive floating gate is formed on a part of the channel region, isolation is made therefrom, and an edge directed horizontally extends therefrom. A conductive control gate is formed, and includes a first portion arranged in the trench, and a second portion arranged adjacent to the edge of the floating gate and isolated therefrom.

SUMMARY

However, the present inventor has recognized the following point. Namely, a demand for speeding up the nonvolatile semiconductor memory device has been increased with an advanced information processing technique. In order to operate the semiconductor device disclosed in JP-A-2003-234422 at a high speed, a region corresponding to the channel of a control gate needs to be sufficiently inverted during reading. In this time, when a region corresponding to the channel on the side surface of the control gate is sufficiently inverted, a distance to the bottom portion of the source is shorter. For that reason, punch-through is liable to occur through a deeper portion below the charge storage layer.

As described above, a nonvolatile semiconductor memory device having a higher integration degree has been demanded. For that reason, further miniaturization of the memory elements has been demanded. However, when a region for suppressing the occurrence of the punch-through is intended to be ensured, it is necessary to lengthen the region corresponding to the channel below the charge storage layer, which may prevent miniaturization.

An exemplary problem to be solved by the present invention is to provide a nonvolatile semiconductor memory device that enables high-speed operation while suppressing an increase in the area.

The present invention seeks to solve one or more of the above problems, or to improve upon those problems at least in part.

In one exemplary embodiment, a nonvolatile semiconductor memory device includes a semiconductor substrate that includes a trench, a charge storage layer that is formed inside of the trench, a first gate that is formed above a side surface and a bottom surface of the trench, a second gate that is formed beside the first gate, and that is formed above the charge storage layer, a first diffusion region that is formed on the semiconductor substrate inside of the trench, and a second diffusion region that is formed on the semiconductor substrate outside of the trench.

In another exemplary embodiment, a nonvolatile semiconductor device includes a semiconductor substrate that includes a trench, the trench including a first side surface, a second side surface, and a bottom surface, a first charge storage layer that is formed above the bottom surface, a second charge storage layer that is formed above the bottom surface, a first gate that is formed above the first side surface and the bottom surface, a second gate that is formed above the second side surface and the bottom surface, a third gate that is formed beside the first gate, and that is formed above the first charge storage layer, a fourth gate that is formed beside the second gate, and that is formed above the second charge storage layer, a first diffusion region that is formed on the semiconductor substrate at a position according to an area between the third gate and the fourth gate, a second diffusion region that is formed on the semiconductor substrate outside of the trench, and a third diffusion region that is formed on the semiconductor substrate outside of the trench.

In yet another exemplary embodiment, a method of manufacturing a nonvolatile semiconductor memory device includes forming a trench in a semiconductor substrate, forming a first gate at a corner of the trench, covering the first gate and a surface of the semiconductor substrate inside of the trench with an insulating layer for a charge storage layer, covering the insulating layer with a conductive layer for a second gate, etching the insulating layer and the conductive layer to form the charge storage layer and the second gate, forming a first diffusion region on the semiconductor substrate inside of the trench, and forming a second diffusion region on the semiconductor substrate outside of the trench.

Therefore, the present invention can provide a nonvolatile semiconductor memory device that enables a high-speed operation while suppressing an increase in the area.

BRIEF DESCRIPTION OF THE DRAWINGS

The above and other purposes, advantages and features of the present invention will become more apparent from the following description of certain exemplary embodiments taken in conjunction with the accompanying drawings in which:

FIG. 33A is a plan view illustrating a twelfth step of a manufacturing for the semiconductor device 10 according to the second exemplary embodiment;

FIG. 33B is a cross-sectional view illustrating the twelfth step of the manufacturing for a cross-section along B-B' of FIG. 33A;

FIG. 33C is a cross-sectional view illustrating the twelfth step of the manufacturing for a cross-section along C-C' of FIG. 33A;

FIG. 33D is a cross-sectional view illustrating the twelfth step of the manufacturing for a cross-section along D-D' of FIG. 33A;

FIG. 33E is a cross-sectional view illustrating the twelfth step of the manufacturing for a cross-section along E-E' of FIG. 33A;

FIG. 34B is a cross-sectional view illustrating the thirteenth step of the manufacturing for a cross-section along B-B' of FIG. 34A;

FIG. 34C is a cross-sectional view illustrating the thirteenth step of the manufacturing for a cross-section along C-C' of FIG. 34A;

FIG. 34D is a cross-sectional view illustrating the thirteenth step of the manufacturing for a cross-section along D-D' of FIG. 34A; and FIG. 34E is a cross-sectional view illustrating the thirteenth step of the manufacturing for a cross-section along E-E' of FIG. 34A.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention, and that the invention is not limited to the exemplary embodiments illustrated for explanatory purposes.

First Exemplary Embodiment

Figure 1:
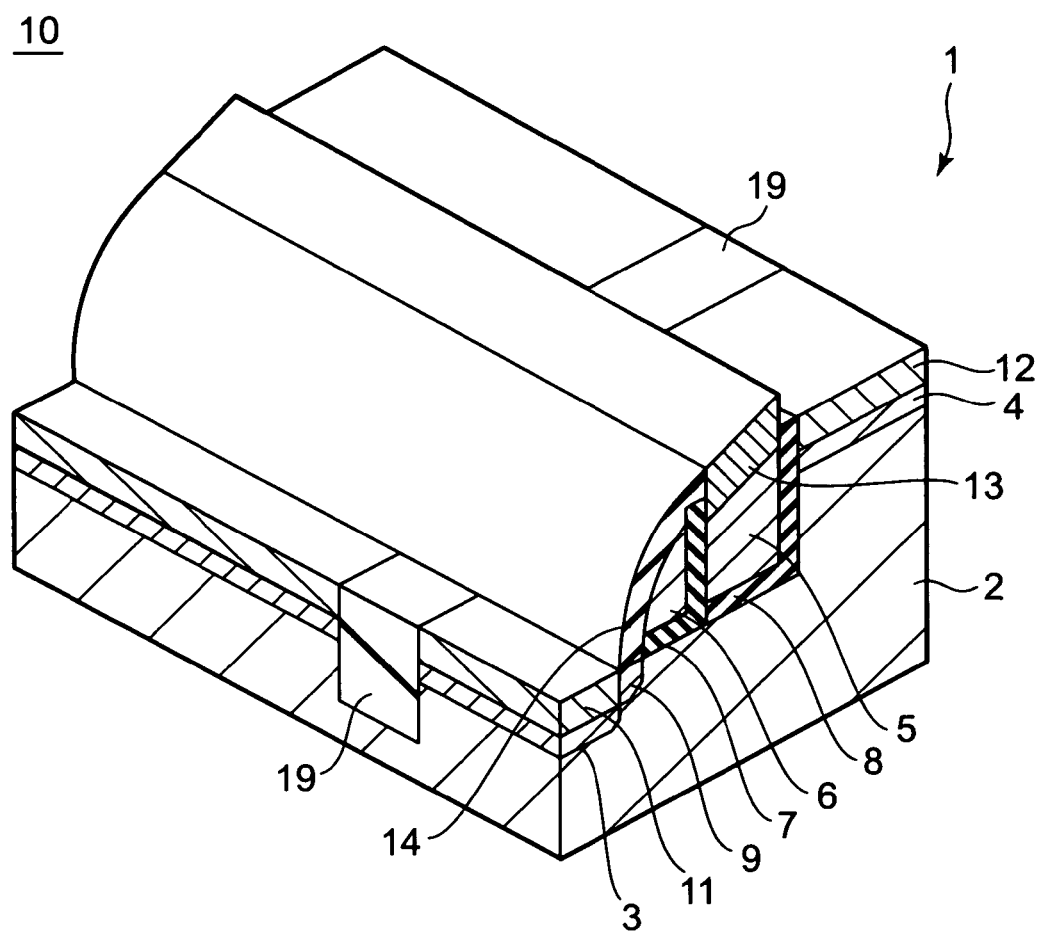
FIG. 1 is a perspective view illustrating a three-dimensional configuration of a storage element 1 in a semiconductor device 10 according to a first exemplary embodiment.

FIG. 1 is a perspective view exemplifying a cubic configuration of a memory element 1 disposed in a semiconductor device 10 according to a first exemplary embodiment. The semiconductor device 10 includes a plurality of memory elements 1. The memory element 1 includes a first source/drain diffusion layer 3, and a second source/drain diffusion layer 4. The first source/drain diffusion layer 3 and the second source/drain diffusion layer 4 are formed on the semiconductor substrate 2. Also, the memory element 1 includes a control gate 5 and a memory gate 6 which are adjacent to each other through a charge storage layer (e.g., an oxide nitride oxide film, hereinafter referred to as an "ONO film") 7. A lightly-doped diffusion (LDD) region 9 is formed on the semiconductor substrate 2 between the first source/drain diffusion layer 3 and the memory gate 6.

A gate insulating film 8 is formed between the control gate 5 and the semiconductor substrate 2. The charge storage layer (ONO film) 7 is formed between the memory gate 6 and the semiconductor substrate 2. The charge storage layer (ONO film) 7 is also formed between the memory gate 6 and the control gate 5. A side wall 15 is formed on a side surface of the second source/drain diffusion layer 4 side of the control gate 5. A control gate silicide 13 is formed on the control gate 5. A second diffusion layer silicide 12 is formed on the second source/drain diffusion layer 4. A cell side wall 14 extends from the side surface of the first source/drain diffusion layer 3 side of the memory gate 6 toward the upper surface thereof.

As shown in FIG. 1, the control gate 5 and the memory gate 6 are formed inside of the trench formed on the semiconductor substrate 2. Also, the first source/drain diffusion layer 3 is formed inside of the trench, and the second source/drain diffusion layer 4 is formed outside of the trench.

Figure 2:
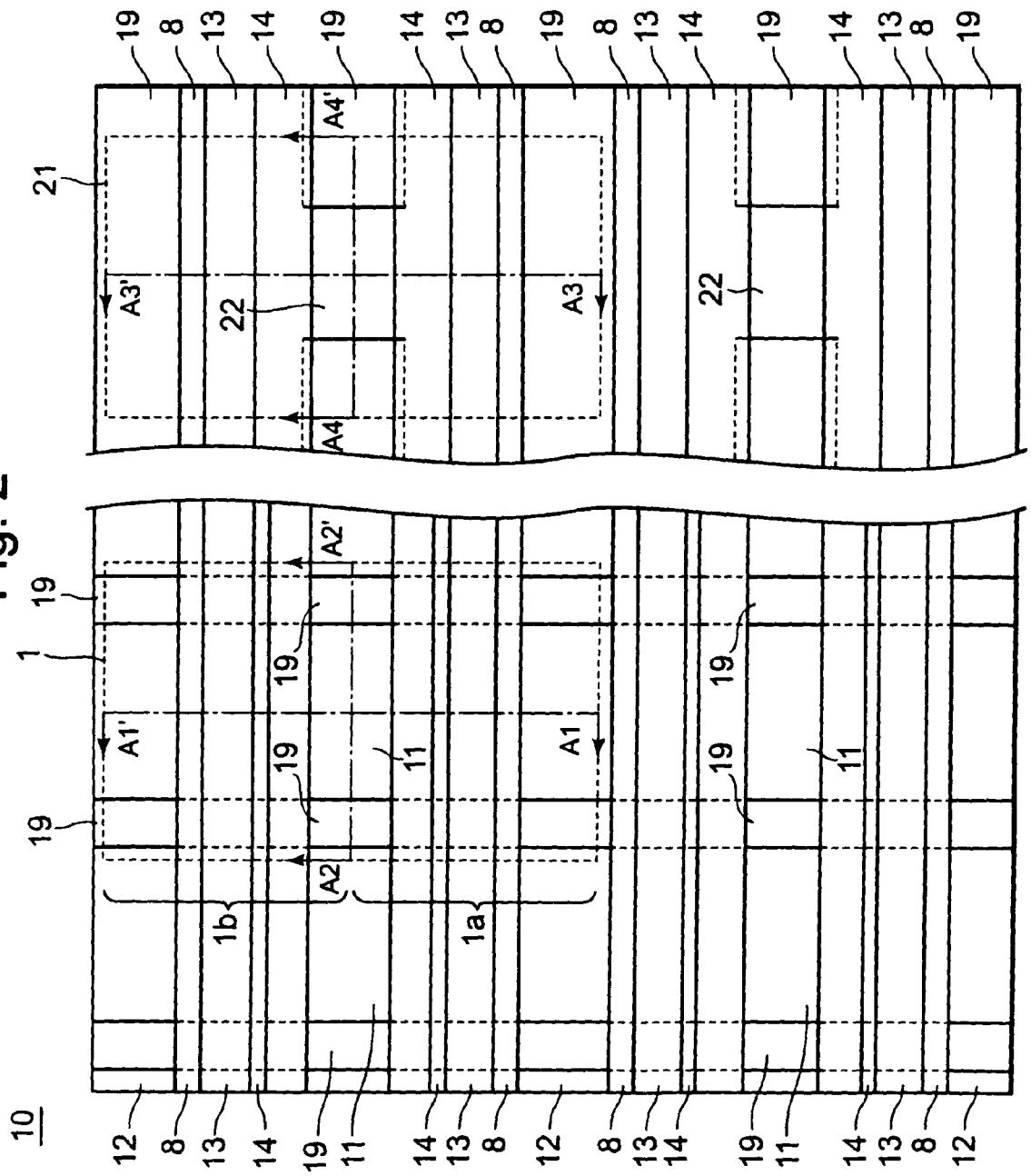
FIG. 2 is a plan view illustrating a configuration of the semiconductor device 10 according to the first exemplary embodiment.

FIG. 2 is a plan view exemplifying a configuration of the semiconductor device 310 according to the first exemplary embodiment which is viewed from the upper surface. Each of the plurality of memory elements 1 disposed in the semiconductor device 10 includes two memory cells (i.e., first memory cell 1a, second memory cell 1b). In the first exemplary embodiment, the first memory cell 1a and the second memory cell 1b are symmetrical with each other with the same structure. Accordingly, hereinafter, a description of portions where the first memory cell 1a and the second memory cell 1b are duplicated will be omitted. In the first exemplary embodiment, the configuration and operation will be described in correspondence with the first memory cell 1a.

Referring to FIG. 2, the semiconductor device 10 includes a memory element region in which the above memory element 1 is arranged in an array, and a contact region 21 in which a contact (i.e., memory gate contact 23: not shown) connected to the memory gate 6 is formed. As shown in FIG. 2, the plurality of memory elements 1 arranged in the semiconductor device 10 is separated respectively by element isolation regions 19 that extend along a first direction. The gates (i.e., the control gates 5, the memory gates 6) of the plurality of memory elements 1 are configured along a second direction perpendicular to the first direction. Also, the contact region 21 is configured to include the element isolation regions 19. As shown in FIG. 2, the contact region 21 includes the memory gate silicide 22. The memory silicide 22 is formed on the element isolation region 19. The memory gate silicide 22 is connected with a memory gate contact 23 (not shown) which will be described later.

Figure 3:
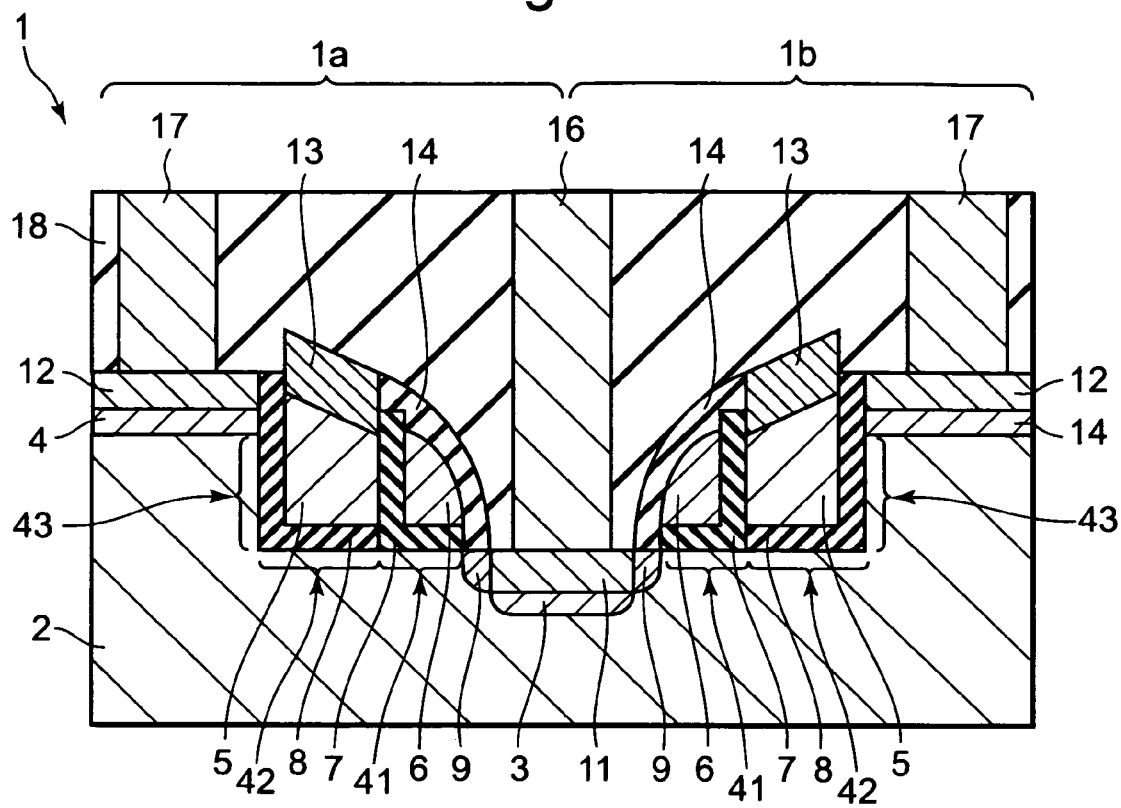
FIG. 3 is a cross-sectional view illustrating a configuration of a cross-section along A1-A1' of FIG. 2.

FIG. 3 is a cross-sectional view exemplifying the configuration of a cross section of the memory element 1 according to the first exemplary embodiment. FIG. 3 exemplifies the configuration of the cross section of the above-mentioned semiconductor device 10 shown in FIG. 2 which is cut at a position indicated by A1-A1'. As shown in FIG. 3, the memory element 1 according to the first exemplary embodiment includes the first source/drain diffusion layer 3 configured inside of the trench, and the second source/drain diffusion layer 4 configured outside of the trench. The control gate 5 and the memory gate 6 are formed inside of the trench. A first channel region 41 below the memory gate 6, a second channel region 42 below the control gate 5, and a third channel region 43 on a side surface of the control gate 5 are formed between the first source/drain diffusion layer 3 and the second source/drain diffusion layer 4.

The second diffusion layer silicide 12 is formed on the second source/drain diffusion layer 4. The second source/drain diffusion layer 4 is connected to the second source/drain contact 17 through the second diffusion layer silicide 12. The first source/drain diffusion layer 3 of the first memory cell 1a (or the second memory cell 1b) is connected to the first source/drain contact 16 through the first diffusion layer silicide 11. As shown in FIG. 3, in the first exemplary embodiment, the first source/drain contact 16 is connected to the first diffusion layer silicide 11, and the first diffusion silicide 11 is connected to the first source/drain diffusion layer 3 through no polysilicon.

Figure 4:
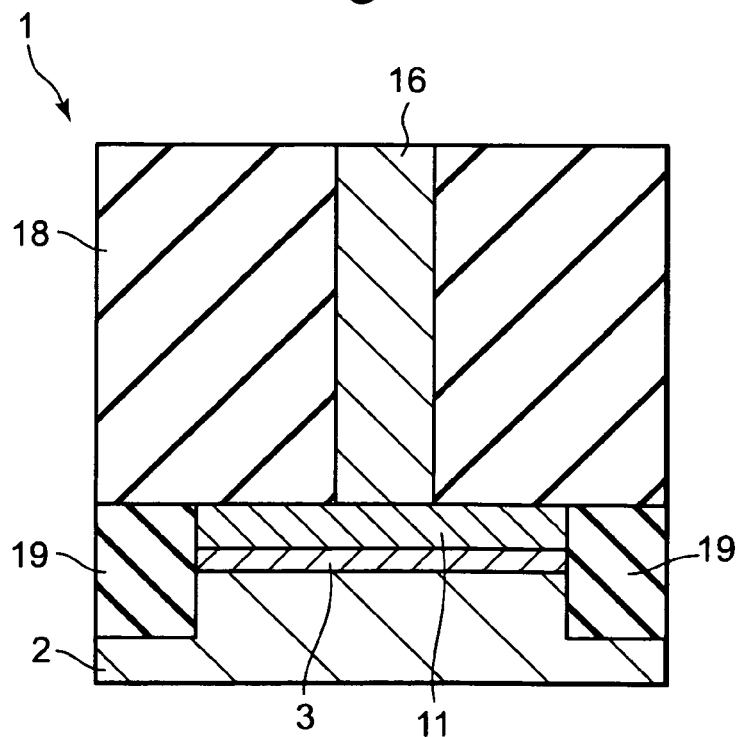
FIG. 4 is a cross-sectional view illustrating a configuration of another cross-section along A2-A2' of FIG. 2.

FIG. 4 is a cross-sectional view exemplifying the configuration of the cross section of the semiconductor device 10 according to the first exemplary embodiment, which is cut at a position indicated by A2-A2' of the above FIG. 2. As shown in FIG. 4, the first source/drain diffusion layer 3 is formed on the semiconductor substrate 2 between the element isolation regions 19. The first diffusion layer silicide 11 is formed between the element isolation regions 19 as with the first source/drain diffusion layer 3. The first source/drain contact 16 is formed in a contact hole that penetrates through an interlayer insulating film 18.

Figure 5:
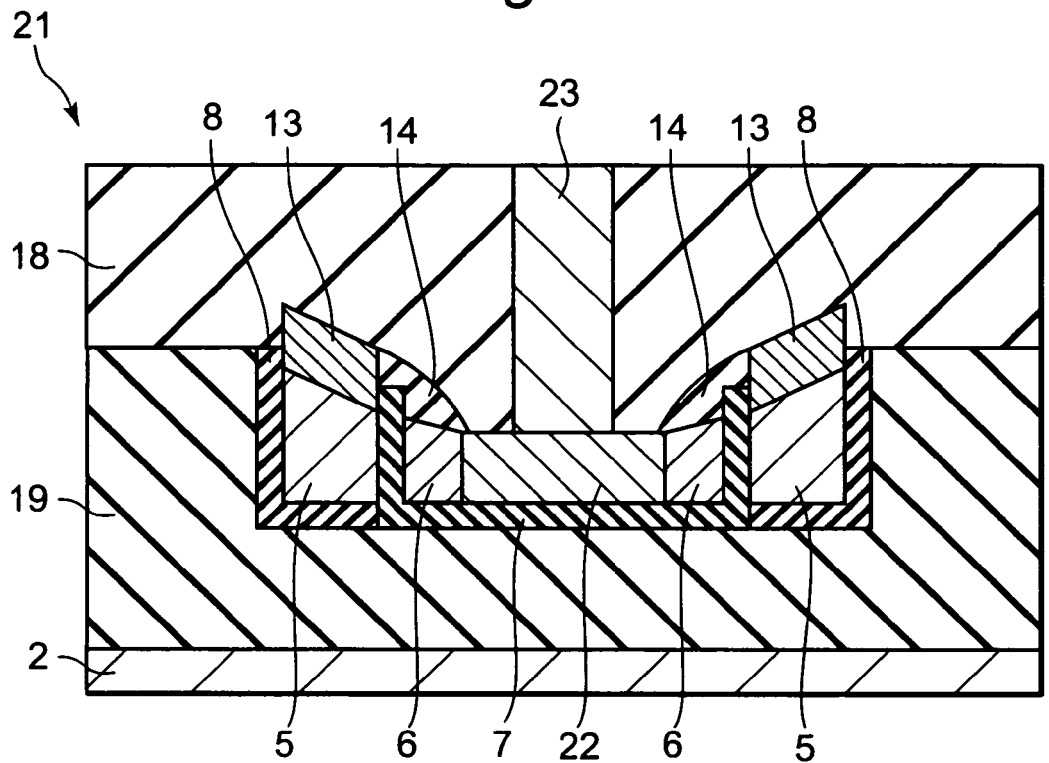
FIG. 5 is a cross-sectional view illustrating a configuration of a cross-section along A3-A3' of FIG. 2.

FIG. 5 is a cross-sectional view exemplifying the configuration of the cross section of the contact region 21. FIG. 5 exemplifies the configuration of the contact region 21 according to the first exemplary embodiment, which is cut at a position indicated by A3-A3' of FIG. 2. As with the above memory element, the contact region 21 has a symmetrical structure. The contact region 21 is formed on the element isolation region 19 formed on the semiconductor substrate 2. The memory gate silicide 22 of the contact region 21 is connected to two opposite memory gates 6. One of the memory gates 6 is connected to the memory gate 6 of the above first memory cell 1a. The other memory gate 6 is connected to the memory gate 6 of the second memory cell 1b.

The upper surface of the memory gate 6 included in the contact region 21 is covered with the cell side wall 14. Also, the charge storage layer (ONO film) 7 is formed between the memory gate 6 and the element isolation region 19, and the charge storage layer (ONO film) 7 is also formed between the memory gate silicide 22 and the element isolation region 19. The memory gate contact 23 connected to the memory gate silicide 22 is formed into the contact hole that penetrates through the interlayer insulating film 18. As shown in FIG. 5, in the contact region 21 according to the first exemplary embodiment, the memory gate silicide 22 is formed inside of the trench.

Figure 6:
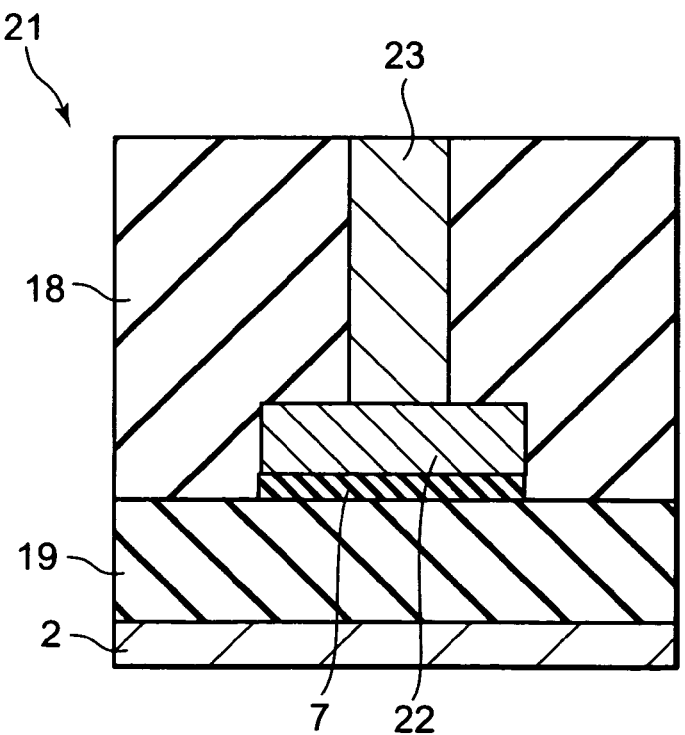
FIG. 6 is a cross-sectional view illustrating a configuration of another cross-section along A4-A4' of FIG. 2.

FIG. 6 is a cross-sectional view exemplifying the configuration of the cross section of the contact region 21. FIG. 6 exemplifies the configuration of the contact region 21 according to the first exemplary embodiment, which is cut at a position indicated by A4-A4' of FIG. 2. As shown in FIG. 6, the cell side wall 14 is formed on the side surface of the memory gate silicide 22 in the contact region 21.

In the memory element 1 according to the first exemplary embodiment, a positive voltage (for example, 4.5 V) is applied to the first source/drain diffusion layer 3 during writing. Also, a positive voltage (for example, 5.5 V) is applied to the memory gate 6. Then, a ground voltage is applied to the second source/drain diffusion layer 4. In this case, parts of electrons that flow into the first source/drain diffusion layer 3 from the second source/drain diffusion layer 4 are accelerated by a channel at a power portion of the memory gate 6. The accelerated electrons are implanted into the charge storage layer (ONO film) 7 below the memory gate 6 to write information.

During erasing, a positive voltage (for example, 4.5 V) is applied to the first source/drain diffusion layer 3. Also, a negative voltage (for example, −3.0 V) is applied to the memory gate 6. In this situation, an electron-hole pair caused by an inter-band tunnelling occurs in the vicinity of the first source/drain diffusion layer 3 at the lower portion of the memory gate 6. Parts of the holes are accelerated by an electric field of the first source/drain diffusion layer 3, and implanted into the charge storage layer (ONO film) 7 to execute erasing. It is preferable that a voltage applied to the control gate 5 during erasing is a voltage of about 0 to −3 V.

During reading, a ground voltage is applied to the first source/drain diffusion layer 3. Also, a positive voltage (for example, 2.0 V) is applied to the memory gate 6. Further, a positive voltage (for example, 1.0V) is applied to the second source/drain diffusion layer 4 to detect a current flowing between the second source/drain diffusion layer 4 and the first source/drain diffusion layer 3. In this situation, in a state where electrons are trapped in the charge storage layer (ONO film) 7 (i.e., write state), the flowing current is small. Also, in a state where holes are trapped in the charge storage layer (ONO film) 7, or in a state where charges are hardly trapped (i.e., erase state), the flowing current is large.

As described above, the memory element 1 according to the first exemplary embodiment includes a control gate 5 inside of the trench formed on the semiconductor substrate 2, and the second source/drain diffusion layer 4 formed outside of the trench. A step is formed between the control gate 5 and the second source/drain diffusion layer 4, and the side surface of the trench acts as the channel region. As a result, even if the substantial width of the control gate 5 is thinned, the gate length sufficient to suppress the malfunction is configured.

Also, in the memory element 1 according to the first exemplary embodiment, the side surface of the trench is configured as a channel region corresponding to the control gate 5. In other words, the side surface of the trench is so configured as not to be affected by the memory gate 6. With that configuration, the memory element 1 according to the first exemplary embodiment can shorten the length of the channel region below the memory gate 6, and ensure a high ON current.

Also, the memory element 1 according to the first exemplary embodiment includes the memory gate 6 and the charge storage layer (ONO film) 7 inside of the trench. With that configuration, even if the channel region below the control gate 5 is sufficiently inverted, the first source/drain diffusion layer 3 can be prevented from being punched through a deeper portion of the channel of the memory gate 6. For that reason, the memory element 1 according to the first exemplary embodiment can thin the substantial width of the memory gate 6, and reduce the area used for the memory cell.

Hereinafter, a description will be given of a manufacturing process for manufacturing the semiconductor device 10 according to the first exemplary embodiment. The semiconductor device 10 according to the first exemplary embodiment includes the plurality of memory elements 1 and the plurality of contact regions 21. The plurality memory elements 1 and the contact regions 21 are formed at locations apart from each other. Hereinafter, a portion between the location (hereinafter referred to as a "memory element region") in which the memory element 1 is formed, and the location (hereinafter referred to as a "contact region") in which the contact region 21 is formed is omitted, and a description pertained to the manufacturing process of the semiconductor device 10 will be described.

Figure 7A:
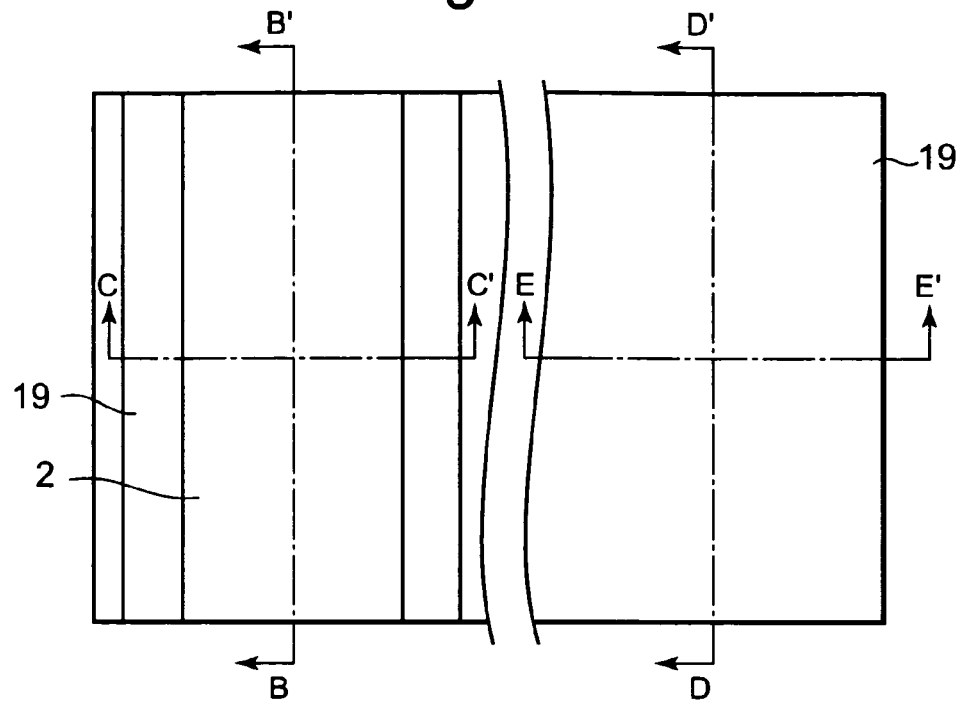
FIG. 7A is a plan view illustrating a first step of a manufacturing for the semiconductor device 10 according to the first exemplary embodiment.
Figure 7B:
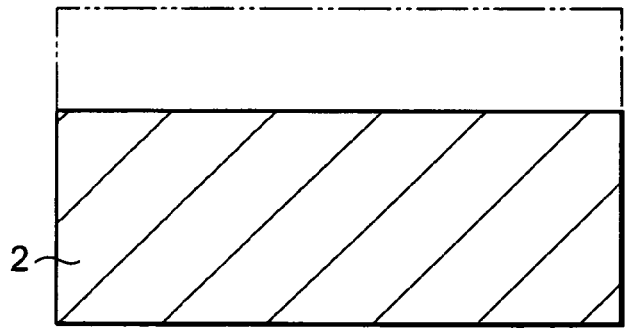
FIG. 7B is a cross-sectional view illustrating the first step of the manufacturing for a cross-section along B-B' of FIG. 7A.
Figure 7C:
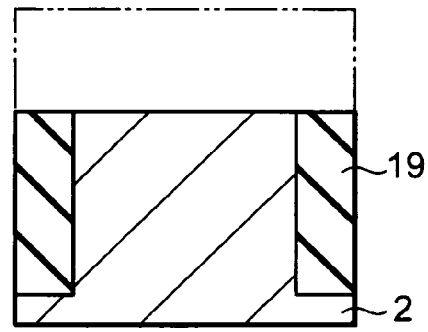
FIG. 7C is a cross-sectional view illustrating the first step of the manufacturing for a cross-section along C-C' of FIG. 7A.
Figure 7D:
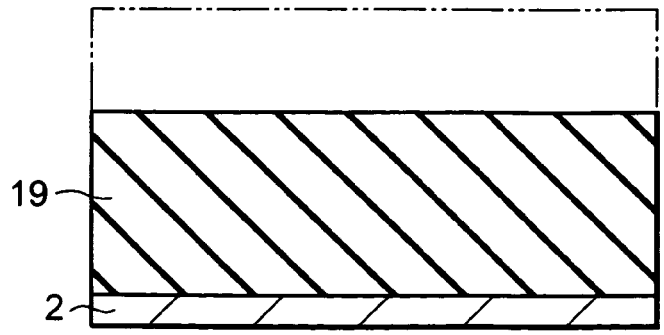
FIG. 7D is a cross-sectional view illustrating the first step of the manufacturing for a cross-section along D-D' of FIG. 7A.
Figure 7E:
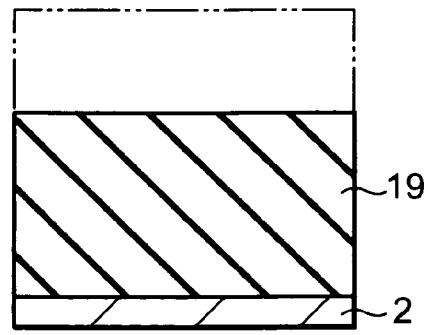
FIG. 7E is a cross-sectional view illustrating the first step of the manufacturing for a cross-section along E-E' of FIG. 7A.

FIGS. 7A to 7E are diagrams exemplifying a state of a first process for manufacturing the memory element 1 according to the first exemplary embodiment. FIG. 7A is a plan view of a semiconductor material in the first process, which is viewed from above. FIG. 7B is a cross-sectional view exemplifying a cross section (hereinafter referred to as "B-B' cross section") of the semiconductor material, which is cut at a position B-B' shown in FIG. 7A. FIG. 7C is a cross-sectional view exemplifying a cross section (hereinafter referred to as "C-C' cross section") of the semiconductor material, which is cut at a position C-C' shown in FIG. 7A. FIG. 7D is a cross-sectional view exemplifying a cross section (hereinafter referred to as "D-D' cross section") of the semiconductor material, which is cut at a position D-D' shown in FIG. 7A. FIG. 7E is a cross-sectional view exemplifying a cross section (hereinafter referred to as "E-E' cross section") of the semiconductor material, which is cut at a position E-E' shown in FIG. 7A.

As shown in FIGS. 7A to 7E, in the first process, the element isolation region 19 is formed on the semiconductor substrate 2.

Figure 8A:
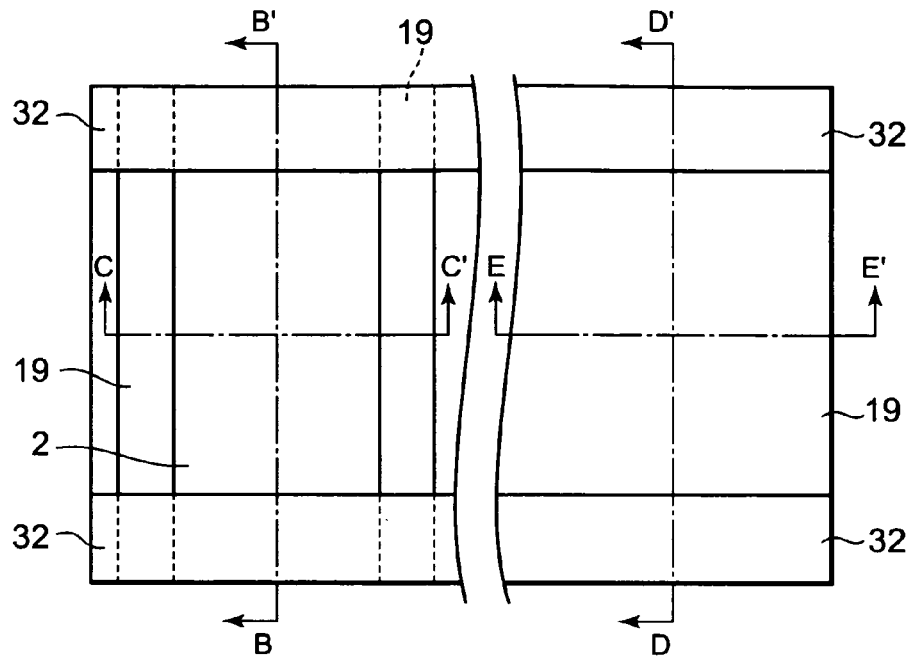
FIG. 8A is a plan view illustrating a second step of a manufacturing for the semiconductor device 10 according to the first exemplary embodiment.
Figure 8B:
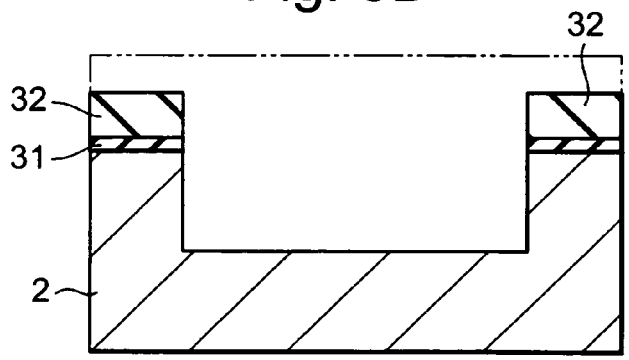
FIG. 8B is a cross-sectional view illustrating the second step of the manufacturing for a cross-section along B-B' of FIG. 8A.
Figure 8C:
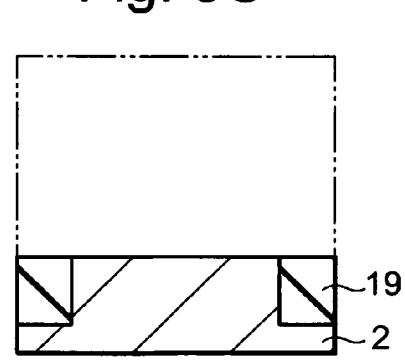
FIG. 8C is a cross-sectional view illustrating the second step of the manufacturing for a cross-section along C-C' of FIG. 8A.
Figure 8D:
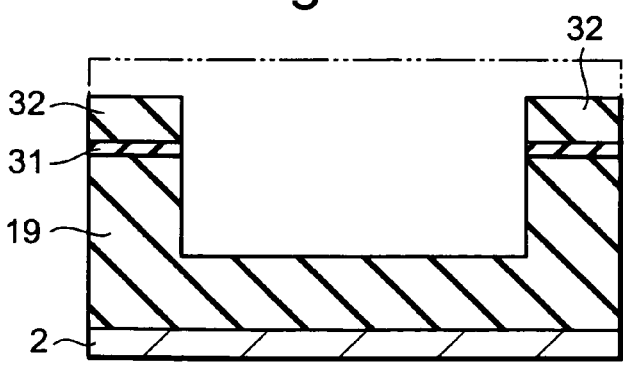
FIG. 8D is a cross-sectional view illustrating the second step of the manufacturing for a cross-section along D-D' of FIG. 8A.
Figure 8E:
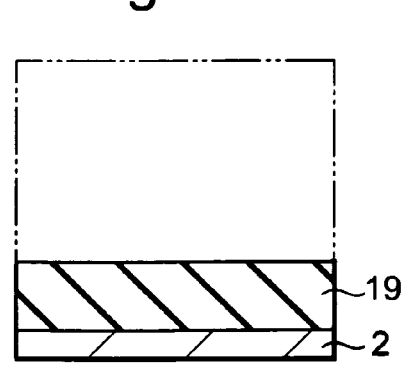
FIG. 8E is a cross-sectional view illustrating the second step of the manufacturing for a cross-section along E-E' of FIG. 8A.

FIGS. 8A to 8E are diagrams exemplifying a state of a second process for manufacturing the memory element 1 according to the first exemplary embodiment. FIG. 8A is a plan view of a semiconductor material in the second process, which is viewed from above. FIG. 8B is a cross-sectional view exemplifying the configuration of a cross section B-B'. FIG. 8C is a cross-sectional view exemplifying the configuration of a cross section C-C'. FIG. 8D is a cross-sectional view exemplifying the configuration of a cross section D-D'. FIG. 8E is a cross-sectional view exemplifying the configuration of a cross section E-E'.

As shown in FIGS. 8B and 8D, an oxide film 31 and a nitride film 32 are formed in order so as to cover the element isolation region 19 and the semiconductor substrate 2. After a resist of a given pattern has been formed on the nitride film 32, the nitride film 32 and the oxide film 31 are removed with the resist as a mask.

As shown in FIG. 8B, in the second process, an opening portion is defined between the nitride film 32 in the memory element region, and the trench is formed on the semiconductor substrate 2 at a position corresponding to the opening portion. Also, as shown in FIG. 8C, in the second process, the element isolation region 19 is ground (e.g., thinned) so as to have the same height as that of the exposed semiconductor substrate 2 in the memory element region. At this time, in the contact region, the trench is formed in the element isolation region 19 as with the semiconductor substrate 2. Accordingly, as shown in FIGS. 8D and 8E, in the contact region, the element isolation region 19 having the trench is formed in the opening portion between the nitride films 32.

Figure 9A:
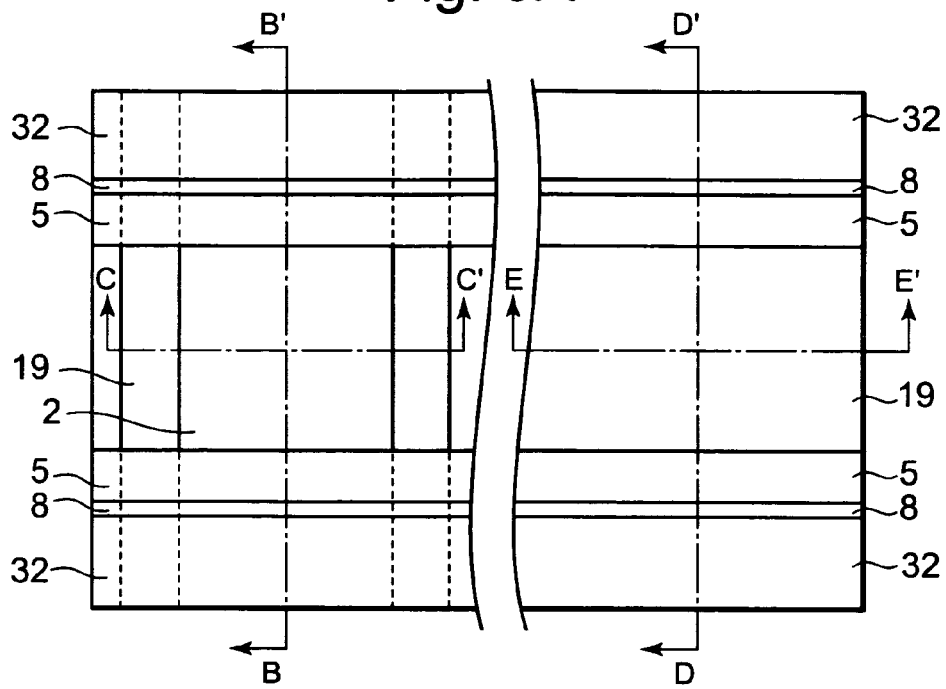
FIG. 9A is a plan view illustrating a third step of a manufacturing for the semiconductor device 10 according to the first exemplary embodiment.
Figure 9B:
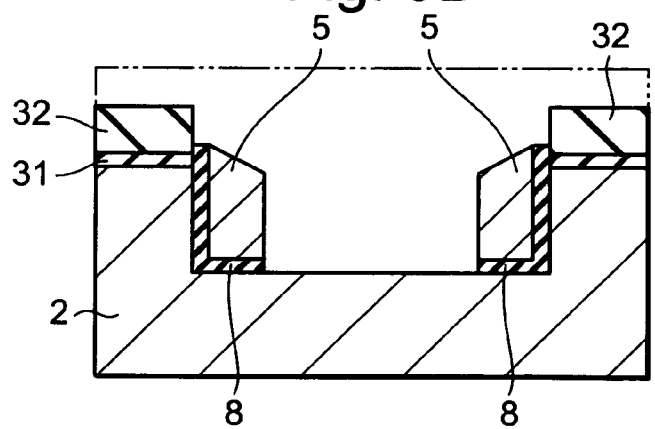
FIG. 9B is a cross-sectional view illustrating the third step of the manufacturing for a cross-section along B-B' of FIG. 9A.
Figure 9C:
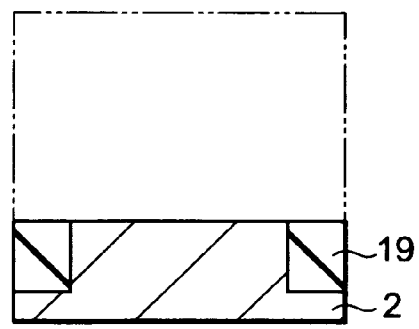
FIG. 9C is a cross-sectional view illustrating the third step of the manufacturing for a cross-section along C-C' of FIG. 9A.
Figure 9D:
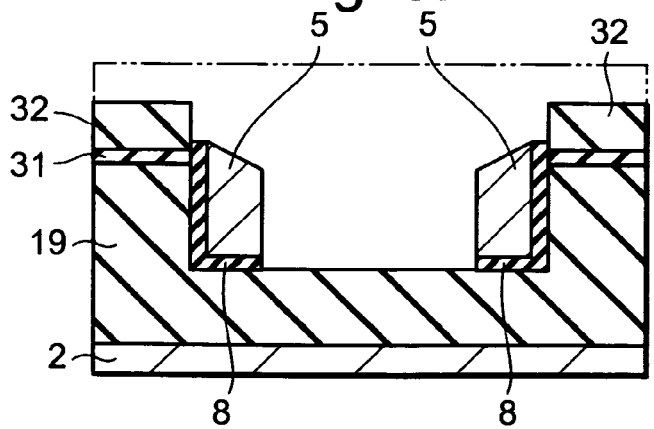
FIG. 9D is a cross-sectional view illustrating the third step of the manufacturing for a cross-section along D-D' of FIG. 9A.
Figure 9E:
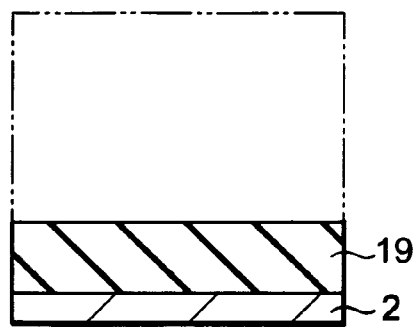
FIG. 9E is a cross-sectional view illustrating the third step of the manufacturing for a cross-section along E-E' of FIG. 9A.

FIGS. 9A to 9E are diagrams showing a state of a third process for manufacturing the memory element 1 according to the first exemplary embodiment. FIG. 9A is a plan view of a semiconductor material of the third process, which is viewed from above. FIG. 9B is a cross-sectional view exemplifying the configuration of a cross section B-B'. FIG. 9C is a cross-sectional view exemplifying the configuration of a cross section C-C'. FIG. 9D is a cross-sectional view exemplifying the configuration of a cross section D-D'. FIG. 9E is a cross-sectional view exemplifying the configuration of a cross section E-E'.

In the third process, an oxide film being the gate insulating film 8 is formed on the surface of the semiconductor substrate 2 inside of the trench, and the surface of the nitride film 32, and a polysilicon film being the control gate 5 is formed thereon. Thereafter, after the polysilicon is etched back to form the control gate 5 being in the form of a side wall, a surplus oxide film is removed to form the gate insulating film 8.

As shown in FIGS. 9B and 9C, the control gate 5 and the gate insulating film 8 are formed inside of the trench in the memory element region in the third process. Also, the semiconductor substrate 2 between the opposite control gates 5 is exposed. Also, as shown in FIGS. 9D and 9E, the control gate 5 and the gate insulating film 8 are formed inside of the trench in the control region in the third process, and the element isolation region 19 between the opposite control gates 5 is exposed.

Figure 10A:
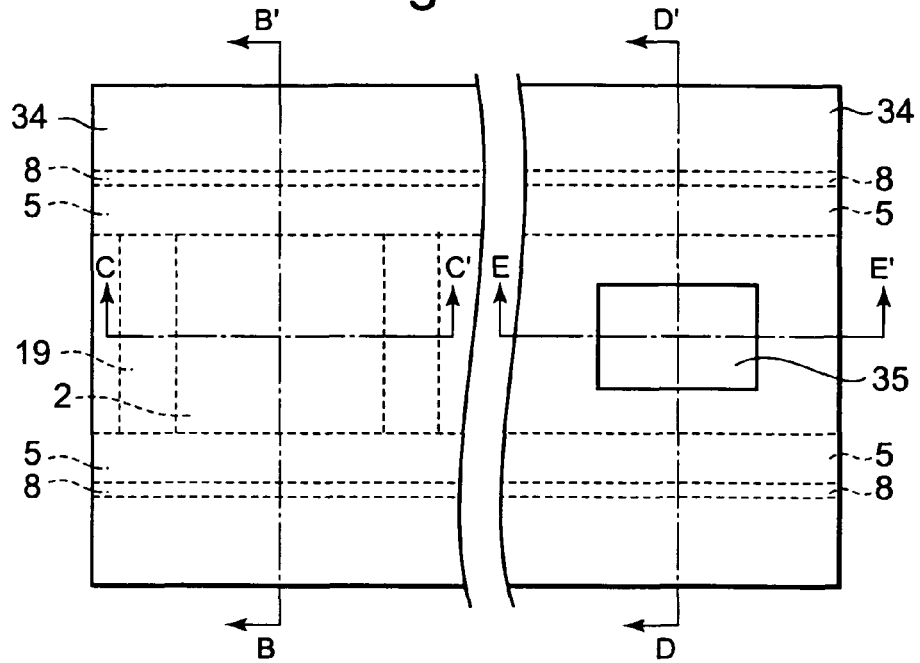
FIG. 10A is a plan view illustrating a fourth step of a manufacturing for the semiconductor device 10 according to the first exemplary embodiment.
Figure 10B:
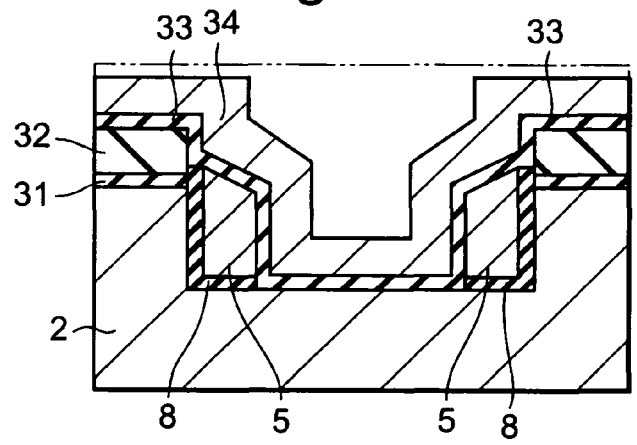
FIG. 10B is a cross-sectional view illustrating the fourth step of the manufacturing for a cross-section along B-B' of FIG. 10A.
Figure 10C:
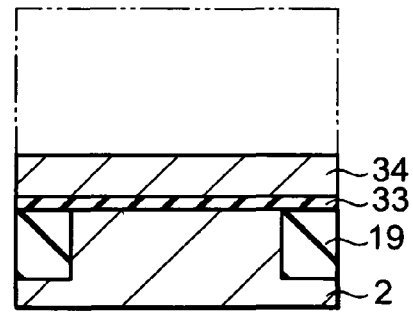
FIG. 10C is a cross-sectional view illustrating the fourth step of the manufacturing for a cross-section along C-C' of FIG. 10A.
Figure 10D:
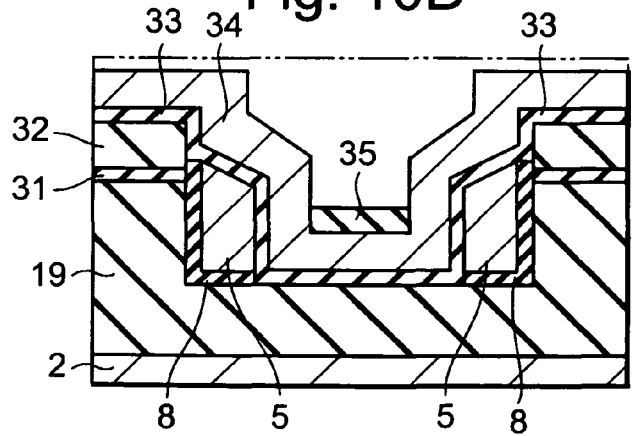
FIG. 10D is a cross-sectional view illustrating the fourth step of the manufacturing for a cross-section along D-D' of FIG. 10A.
Figure 10E:
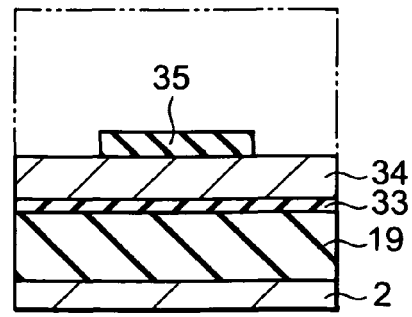
FIG. 10E is a cross-sectional view illustrating the fourth step of the manufacturing for a cross-section along E-E' of FIG. 10A.

FIGS. 10A to 10E are diagrams exemplifying a state of a fourth process for manufacturing the memory element 1 according to the first exemplary embodiment. FIG. 10A is a plan view of a semiconductor material of the fourth process, which is viewed from above. FIG. 10B is a cross-sectional view exemplifying the configuration of a cross section B-B'. FIG. 10C is a cross-sectional view exemplifying the configuration of a cross section C-C'. FIG. 10D is a cross-sectional view exemplifying the configuration of a cross section D-D'. FIG. 10E is a cross-sectional view exemplifying the configuration of a cross section E-E'.

As shown in FIGS. 10B to 10E, in the fourth process, after a charge storage film (ONO film) 33 being the charge storage layer (ONO film) 7 has been formed, a memory gate polysilicon film 34 being the memory gate 6 is formed thereon. As shown in FIG. 10A, in the contact region, in the fourth process, a first proactive oxide film 35 is further formed on the memory gate polysilicon film 34.

As shown in FIG. 10B, in the B-B' cross section of the memory element region is formed the charge storage film (ONO film) 33 that covers the surface of the semiconductor substrate 2 exposed inside of the trench, the side surface and the upper surface of the control gate 5, and the side surface and the upper surface of the nitride film 32. The memory gate polysilicon film 34 is formed on the charge storage film (ONO film) 33. Also, the memory gate polysilicon film 34 is formed to provide an opening portion. As shown in FIG. 10C, in the C-C' cross section, the charge storage film (ONO film) 33 and the memory gate polysilicon film 34 are also formed on the element isolation region 19.

As shown in FIG. 10D, in the D-D' cross section of the contact region is formed the charge storage film (ONO film) 33 that covers the surface of the element isolation region 19 that has been exposed inside of the trench, the side surface and the upper surface of the control gate 5, and the side surface and the upper surface of the nitride film 32. The memory gate polysilicon film 34 is then formed on the charge storage film (ONO film) 33. The memory gate polysilicon film 34 is so formed as to provide an opening portion. The first protective oxide film 35 is so formed as to cover the bottom surface of the opening portion. As shown in FIG. 10E, the first protective oxide film 35 is formed so as to correspond to a portion in which the memory gate silicide 22 is formed in a subsequent process.

Figure 11A:
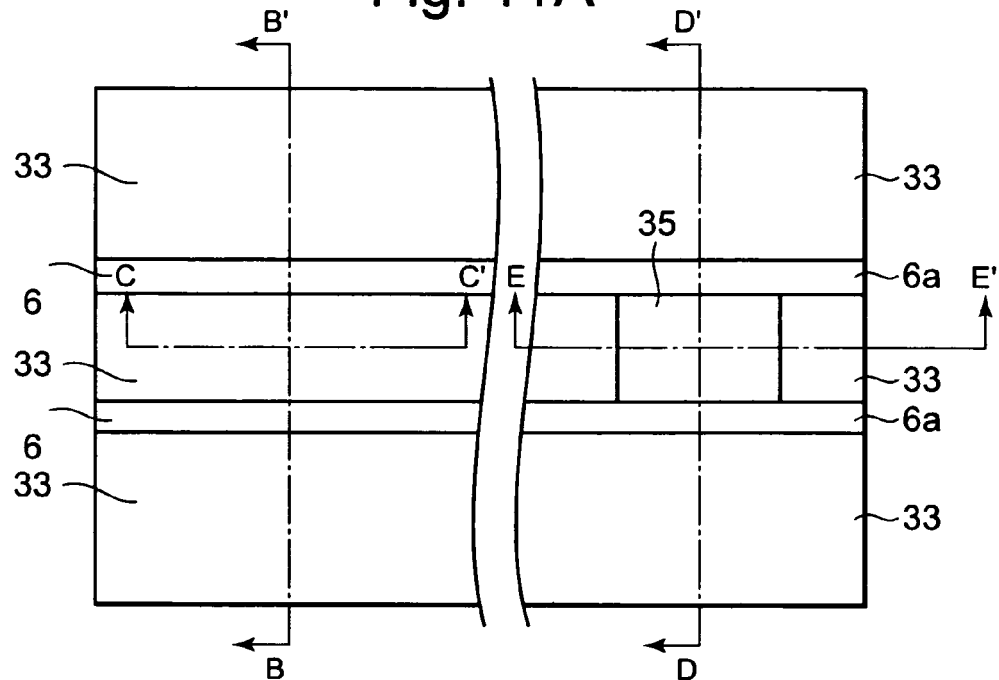
FIG. 11A is a plan view illustrating a fifth step of a manufacturing for the semiconductor device 10 according to the first exemplary embodiment.
Figure 11B:
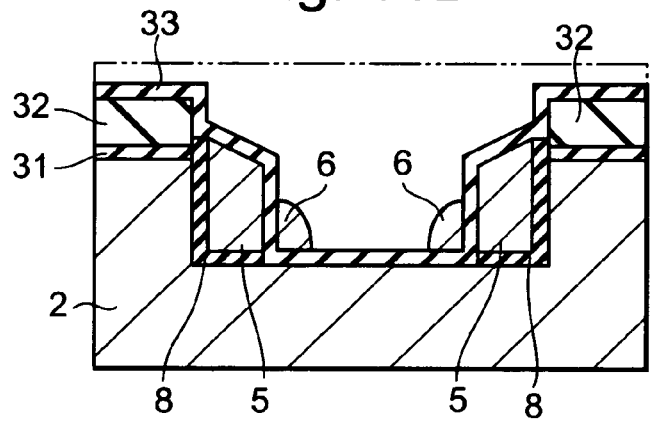
FIG. 11B is a cross-sectional view illustrating the fifth step of the manufacturing for a cross-section along B-B' of FIG. 11A.
Figure 11C:
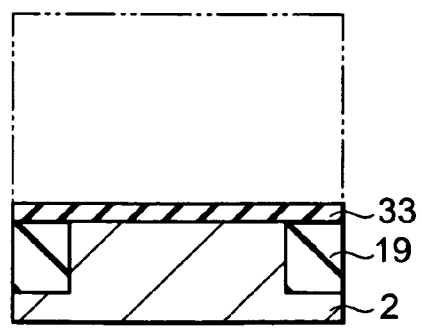
FIG. 11C is a cross-sectional view illustrating the fifth step of the manufacturing for a cross-section along C-C' of FIG. 11A.
Figure 11D:
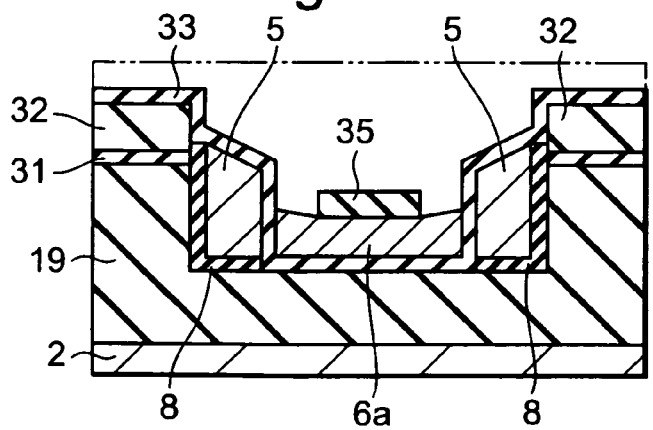
FIG. 11D is a cross-sectional view illustrating the fifth step of the manufacturing for a cross-section along D-D' of FIG. 11A.
Figure 11E:
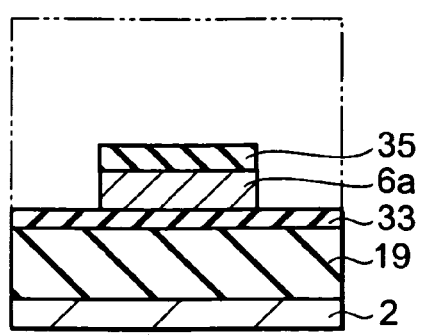
FIG. 11E is a cross-sectional view illustrating the fifth step of the manufacturing for a cross-section along E-E' of FIG. 11A.

FIGS. 11A to 11E are diagrams exemplifying a state of a fifth process for manufacturing the memory element 1 according to the first exemplary embodiment. FIG. 11A is a plan view of a semiconductor material of the fifth process, which is viewed from above. FIG. 11B is a cross-sectional view exemplifying the configuration of a cross section B-B'. FIG. 11C is a cross-sectional view exemplifying the configuration of a cross section C-C'. FIG. 11D is a cross-sectional view exemplifying the configuration of a cross section D-D'. FIG. 11E is a cross-sectional view exemplifying the configuration of a cross section E-E'.

As shown in FIGS. 11A to 11E, in the fifth process, the memory gate polysilicon film 34 is etched back to form the memory gate 6. As shown in FIG. 11B, in the B-B' cross section of the memory element region, the opposite memory gates 6 are formed inside of the trench. The charge storage film (ONO film) 33 is exposed between the opposite memory gates 6. As shown in FIG. 11C, in the C-C' cross section, the charge storage film (ONO film) 33 that covers the element isolation region 19 and the surface of the semiconductor substrate 2 remains.

As shown in FIG. 11D, in the D-D' cross section of the contact region, the memory gate polysilicon film 34 being a memory gate contact region 6a remains on the side of the control gate 5 and below the first protective oxide film 35 inside of the trench. Also, the memory gate polysilicon film 34 also remains on the side of the control gate 5. As shown in FIG. 11E, in the E-E' cross section, the memory gate contact region 6a is formed below the first protective oxide film 35.

Figure 12A:
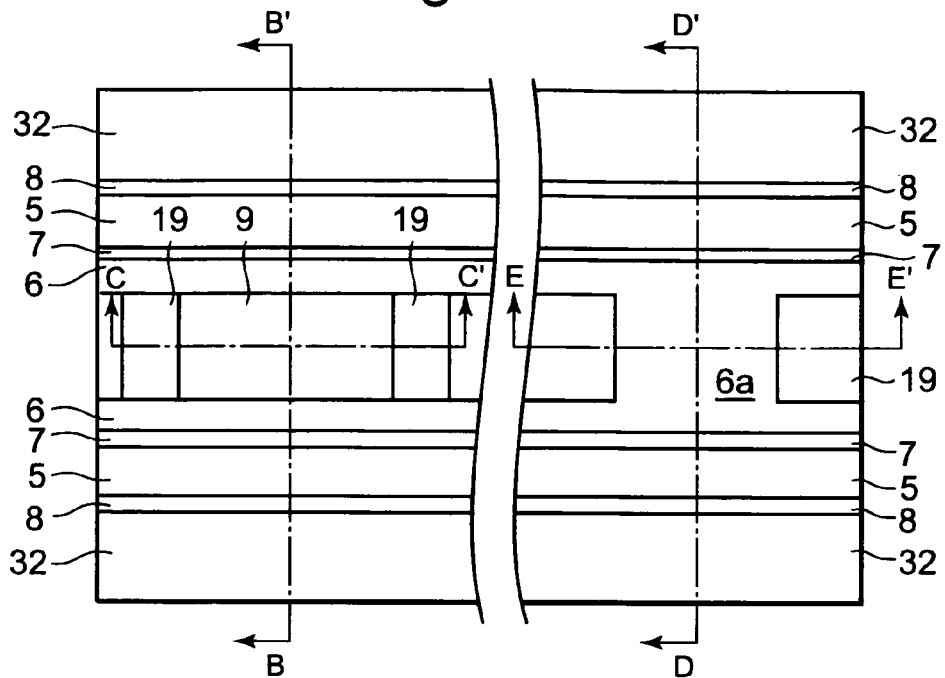
FIG. 12A is a plan view illustrating a sixth step of a manufacturing for the semiconductor device 10 according to the first exemplary embodiment.
Figure 12B:
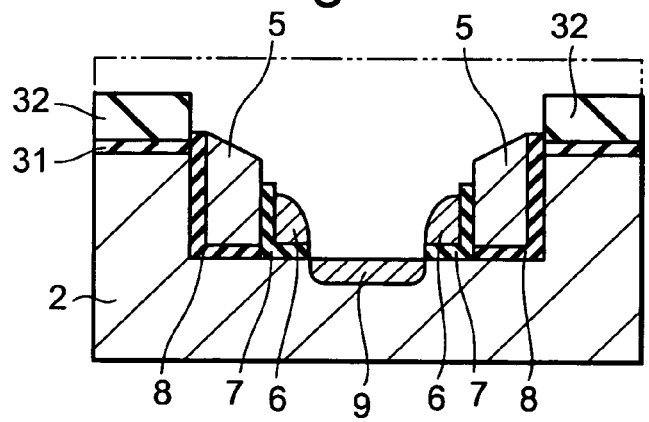
FIG. 12B is a cross-sectional view illustrating the sixth step of the manufacturing for a cross-section along B-B' of FIG. 12A.
Figure 12C:
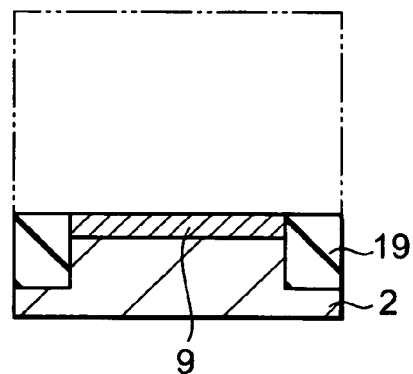
FIG. 12C is a cross-sectional view illustrating the sixth step of the manufacturing for a cross-section along C-C' of FIG. 12A.
Figure 12D:
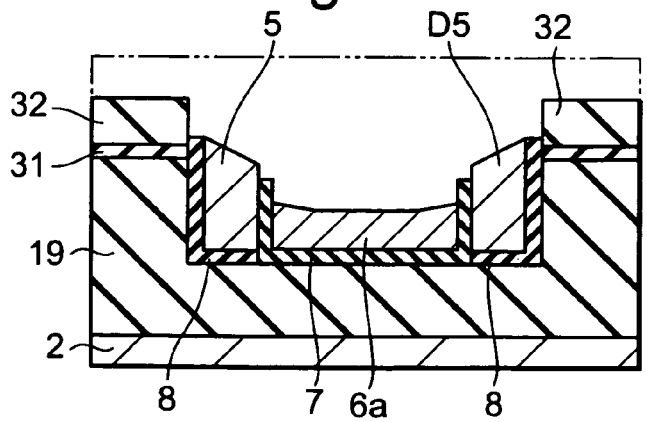
FIG. 12D is a cross-sectional view illustrating the sixth step of the manufacturing for a cross-section along D-D' of FIG. 12A.
Figure 12E:
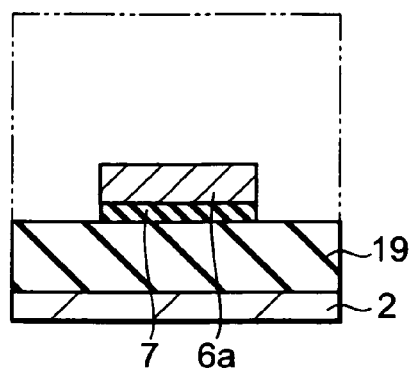
FIG. 12E is a cross-sectional view illustrating the sixth step of the manufacturing for a cross-section along E-E' of FIG. 12A.

FIGS. 12A to 12E are diagrams exemplifying a state of a sixth process for manufacturing the memory element 1 according to the first exemplary embodiment. FIG. 12A is a plan view of a semiconductor material of the sixth process, which is viewed from above. FIG. 12B is a cross-sectional view exemplifying the configuration of a cross section B-B'. FIG. 12C is a cross-sectional view exemplifying the configuration of a cross section C-C'. FIG. 12D is a cross-sectional view exemplifying the configuration of a cross section D-D'. FIG. 12E is a cross-sectional view exemplifying the configuration of a cross section E-E'.

As shown in FIGS. 12A to 12E, in the sixth process, the charge storage film (ONO film) 33 formed between the opposite memory gates 6 inside of the trench is removed, and the charge storage layer (ONO film) 7 is formed below the memory gate 6. Thereafter, impurities (for example, As of about $1E14/cm^2$) are implanted into the exposed semiconductor substrate 2 to form the diffusion layer being the LDD region 9 on the trench bottom surface. In this situation, the first protective oxide film 35 formed on the memory gate contact region 6a is removed in the contact region.

As shown in FIG. 12B, in the sixth process, in the B-B' cross section, the charge storage film (ONO film) 33 that covers the control gate 5 and the nitride film 32 is removed. Also, in this situation, the charge storage film (ONO film) 33 formed between the control gate 5 and the memory gate 6 electrically isolates the remaining control gate 5 and the memory gate 6 from each other. As shown in FIG. 12C, in the C-C' cross section, the LDD region 9 is uniformly formed between the element isolation regions 19. As shown in FIG. 12D, in the D-D' cross section, the first protective oxide film 35 is removed to expose the surface of the memory gate contact region 6a. Also, the charge storage film (ONO film) 33 that covers the control gate 5 and the nitride film 32 is removed while the charge storage film (ONO film) 33 remains below the memory gate contact region 6a, thereby forming the charge storage layer (ONO film) 7. As shown in FIG. 12E, in the E-E' cross section, the first protective oxide film 35 and the charge storage film (ONO film) 33 are removed to expose the surface of the element isolation region 19.

Figure 13A:
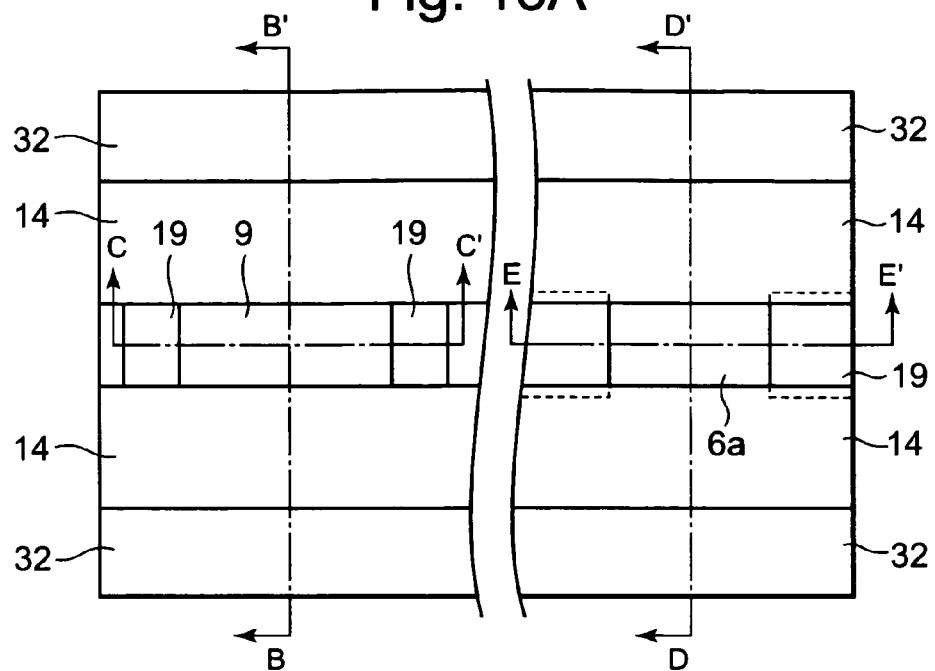
FIG. 13A is a plan view illustrating a seventh step of a manufacturing for the semiconductor device 10 according to the first exemplary embodiment.
Figure 13B:
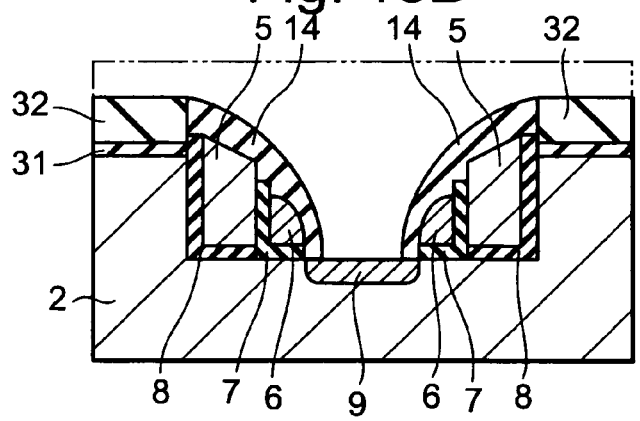
FIG. 13B is a cross-sectional view illustrating the seventh step of the manufacturing for a cross-section along B-B' of FIG. 13A.
Figure 13C:
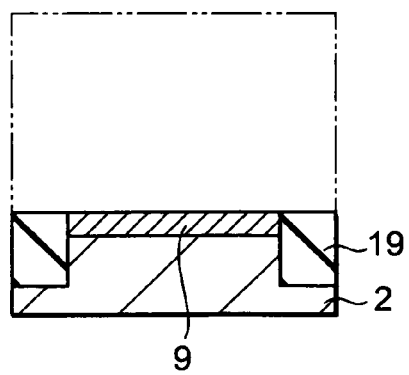
FIG. 13C is a cross-sectional view illustrating the seventh step of the manufacturing for a cross-section along C-C' of FIG. 13A.
Figure 13D:
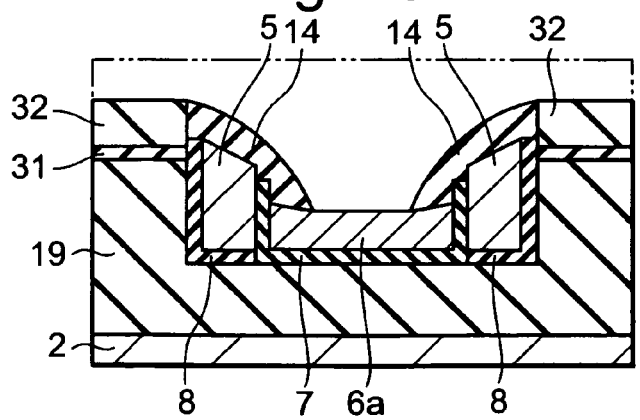
FIG. 13D is a cross-sectional view illustrating the seventh step of the manufacturing for a cross-section along D-D' of FIG. 13A.
Figure 13E:
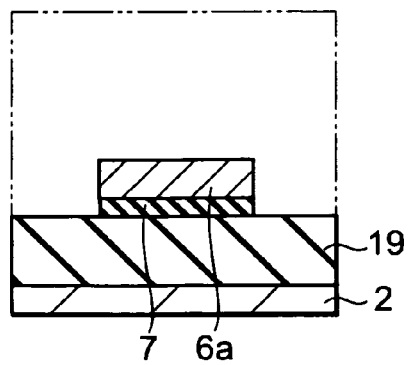
FIG. 13E is a cross-sectional view illustrating the seventh step of the manufacturing for a cross-section along E-E' of FIG. 13A.

FIGS. 13A to 13E are diagrams exemplifying a state of a seventh process for manufacturing the memory element 1 according to the first exemplary embodiment. FIG. 13A is a plan view of a semiconductor material of the seventh process, which is viewed from above. FIG. 13B is a cross-sectional view exemplifying the configuration of a cross section B-B'. FIG. 13C is a cross-sectional view exemplifying the configuration of a cross section C-C'. FIG. 13D is a cross-sectional view exemplifying the configuration of a cross section D-D'. FIG. 13E is a cross-sectional view exemplifying the configuration of a cross section E-E'.

As shown in FIGS. 13B and 13D, in the seventh process, after an oxide film (not shown) that entirely covers the semiconductor material has been formed, the oxide film is etched back to form the cell side walls 14. As shown in FIG. 13B, in the B-B' cross section, in the seventh process, the side surface and upper surface of the memory gate 6, and the upper surface of the control gate 5 are covered with the cell side walls 14. The cell side walls 14 are so formed as to face each other in the B-B' cross section. As shown in FIG. 13C, the C-C' cross section corresponds to the opening portion between the opposite cell side walls 14 to expose the LDD region 9 between the element isolation regions 19.

As shown in FIG. 13D, in the seventh process, in the D-D' cross section, parts of the memory gate contact region 6a and the upper surface of the control gate 5 are covered with the cell side walls 14. The cell side walls 14 have the opening portions, and are so configured as to face each other. As shown in FIG. 13E, in the seventh process, the upper surface of the memory gate contact region 6a is exposed.

Figure 14A:
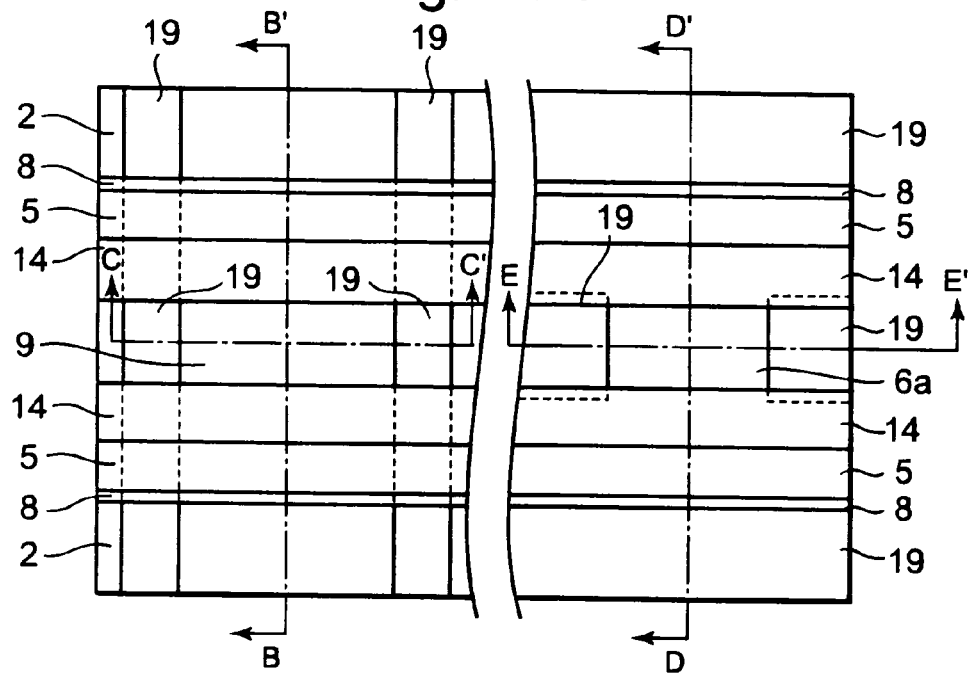
FIG. 14A is a plan view illustrating an eighth step of a manufacturing for the semiconductor device 10 according to the first exemplary embodiment.
Figure 14B:
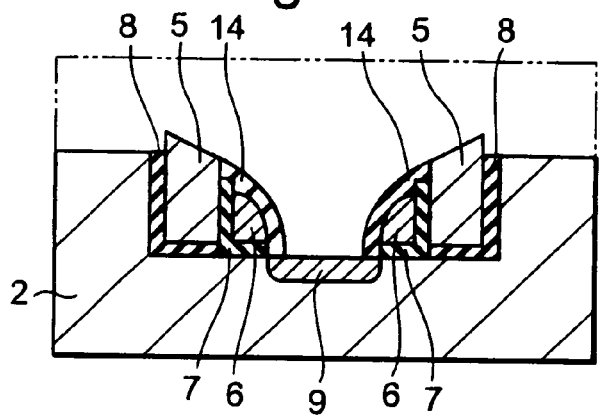
FIG. 14B is a cross-sectional view illustrating the eighth step of the manufacturing for a cross-section along B-B' of FIG. 14A.
Figure 14C:
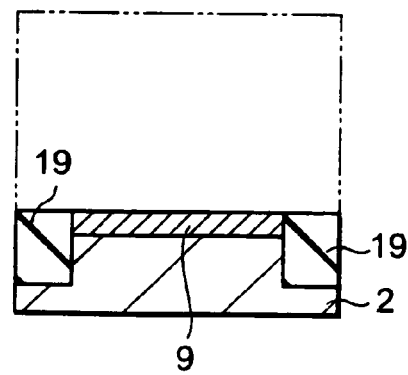
FIG. 14C is a cross-sectional view illustrating the eighth step of the manufacturing for a cross-section along C-C' of FIG. 14A.
Figure 14D:
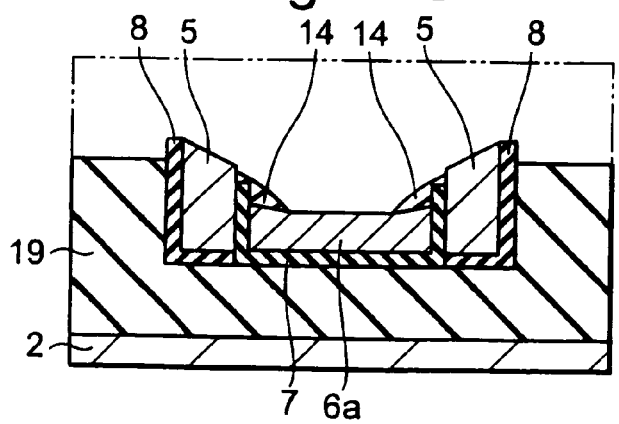
FIG. 14D is a cross-sectional view illustrating the eighth step of the manufacturing for a cross-section along D-D' of FIG. 14A.
Figure 14E:
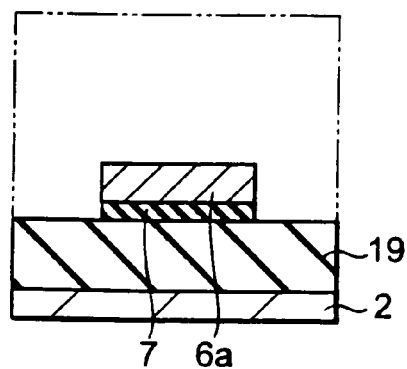
FIG. 14E is a cross-sectional view illustrating the eighth step of the manufacturing for a cross-section along E-E' of FIG. 14A.

FIGS. 14A to 14E are diagrams exemplifying a state of an eighth process for manufacturing the memory element 1 according to the first exemplary embodiment. FIG. 14A is a plan view of a semiconductor material of the eighth process, which is viewed from above. FIG. 14B is a cross-sectional view exemplifying the configuration of a cross section B-B'. FIG. 14C is a cross-sectional view exemplifying the configuration of a cross section C-C'. FIG. 14D is a cross-sectional view exemplifying the configuration of a cross section D-D'. FIG. 14E is a cross-sectional view exemplifying the configuration of a cross section E-E'.

In the eighth process, the surface of the LDD region 9 is protected with an oxide film (not shown) to remove the nitride film 32. In this situation, in the contact region, an oxide film (not shown) that covers the memory gate contact region 6a is formed. Thereafter, the oxide film, and the cell side walls 14 above the control gate 5 are removed. As shown in FIG. 14B, in the eighth process, in the cross section B-B', the upper surface of the control gate 5 and the surface of the semiconductor substrate 2 outside of the trench outside of the control gate 5 are exposed. As shown in FIG. 14C, in the cross section C-C', the surface of the LDD region 9 that is temporarily covered with the oxide film (not shown) is exposed. As shown in FIG. 14D, in the cross section D-D', the upper surface of the control gate 5 inside of the trench, and parts of the surface of the memory gate contact region 6a are exposed. In this situation, the surface of the element isolation region 19 outside of the control gate 5 (outside of the trench) is exposed. As shown in FIG. 14E, in the eighth process, in the cross section E-E', when the nitride film 32 is removed, the memory gate contact region 6a is covered with an oxide film (not shown), and thereafter the oxide film is removed, and the surface of the memory gate contact region 6a is exposed.

Figure 15A:
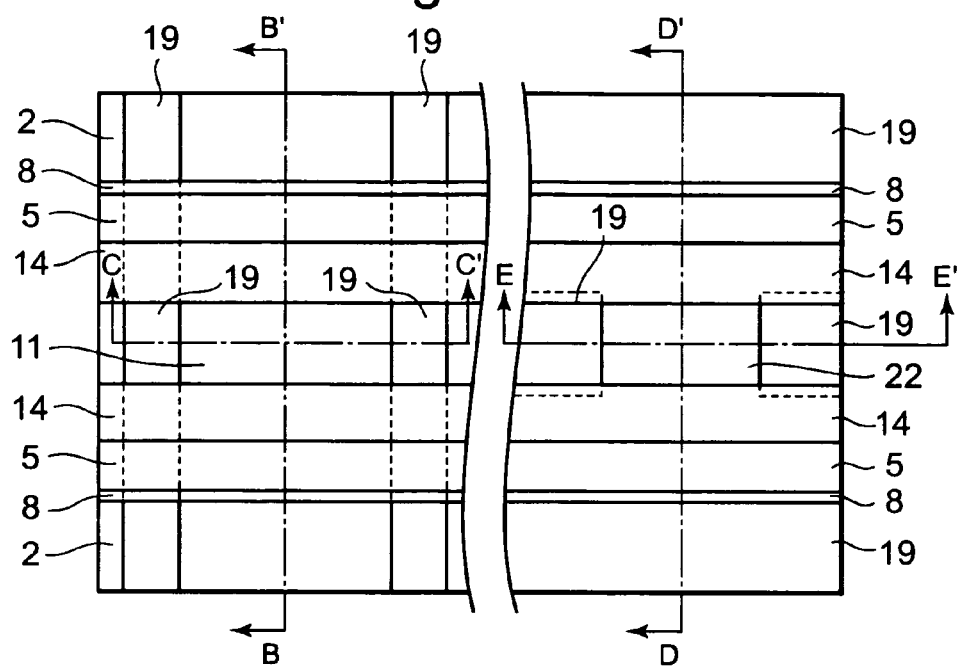
FIG. 15A is a plan view illustrating a ninth step of a manufacturing for the semiconductor device 10 according to the first exemplary embodiment.
Figure 15B:
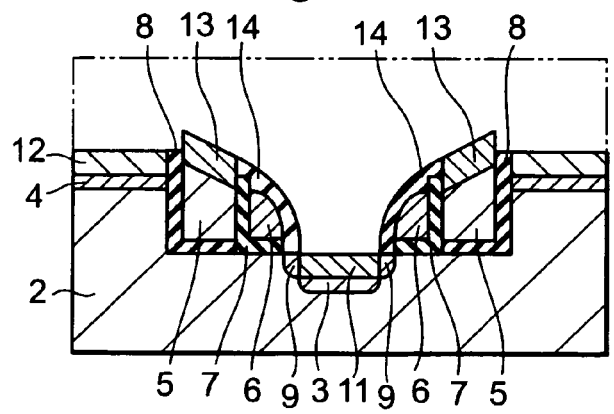
FIG. 15B is a cross-sectional view illustrating the ninth step of the manufacturing for a cross-section along B-B' of FIG. 15A.
Figure 15C:
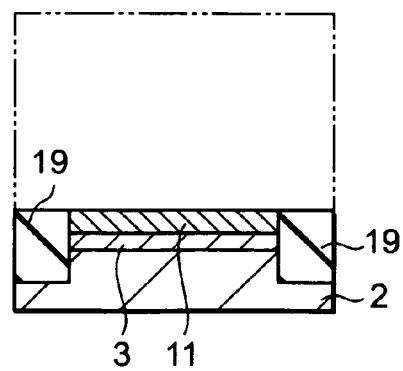
FIG. 15C is a cross-sectional view illustrating the ninth step of the manufacturing for a cross-section along C-C' of FIG. 15A.
Figure 15D:
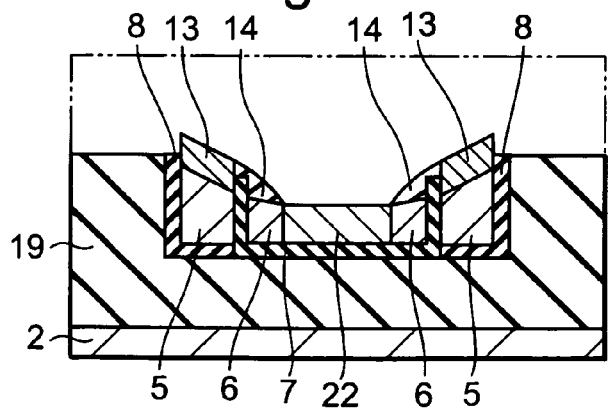
FIG. 15D is a cross-sectional view illustrating the ninth step of the manufacturing for a cross-section along D-D' of FIG. 15A.
Figure 15E:
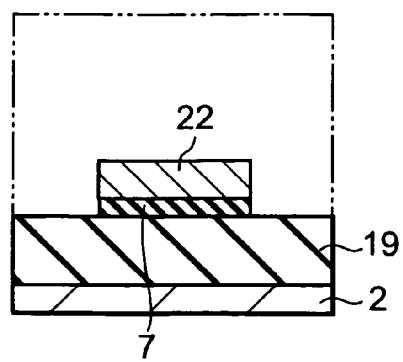
FIG. 15E is a cross-sectional view illustrating the ninth step of the manufacturing for a cross-section along E-E' of FIG. 15A.

FIGS. 15A to 15E are diagrams exemplifying a state of a ninth process for manufacturing the memory element 1 according to the first exemplary embodiment. FIG. 15A is a plan view of a semiconductor material of the ninth process, which is viewed from above. FIG. 15B is a cross-sectional view exemplifying the configuration of a cross section B-B'. FIG. 15C is a cross-sectional view exemplifying the configuration of a cross section C-C'. FIG. 15D is a cross-sectional view exemplifying the configuration of a cross section D-D'. FIG. 15E is a cross-sectional view exemplifying the configuration of a cross section E-E'.

As shown in FIGS. 15B and 15C, in the ninth process, the cell side walls 14 and the control gate 5 are allowed to function as masks, and impurities (for example, As of $2E15/cm^2$) for forming the first source/drain diffusion layer 3 and the second source/drain diffusion layer 4 are implanted. Thereafter, the first source/drain diffusion layer 3 between the cell side walls 14 is silicided to form the first diffusion layer silicide 11. In this situation, at the same time, the second diffusion layer silicide 12 and the control gate silicide 13 are formed. As shown in FIGS. 15D and 15E, in the ninth process, in the contact region, the memory gate silicide 22 is formed.

Thereafter, after the formation of the side wall 15, the interlayer insulating film 18 (not shown) is formed, and contact holes (not shown) for forming the first source/drain contact 16 and the second source/drain contact 17 are formed.

Second Exemplary Embodiment

Figure 16:
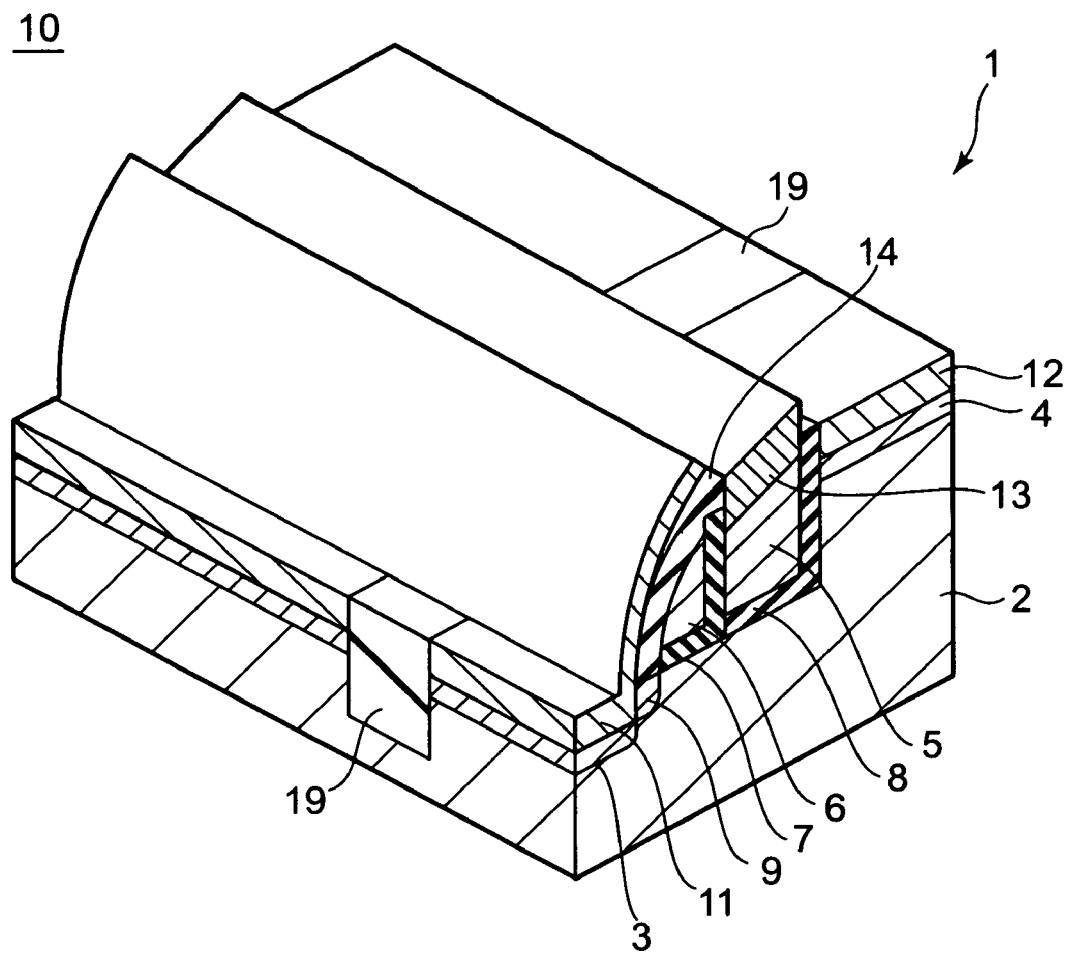
FIG. 16 is a perspective view illustrating a three-dimensional configuration of a storage element 1 in a semiconductor device 10 according to a second exemplary embodiment.

FIG. 16 is a perspective view exemplifying a cubic configuration of a memory element 1 disposed in a semiconductor device 10 according to a second exemplary embodiment. The semiconductor device 10 includes a plurality of memory elements 1. Each of the plurality of memory element 1 includes a first source/drain diffusion layer 3, and a second source/drain diffusion layer 4. The first source/drain diffusion layer 3 and the second source/drain diffusion layer 4 are formed on the semiconductor substrate 2. Also, the memory element 1 includes a control gate 5 and a memory gate 6 which are adjacent to each other through a charge storage layer (ONO film) 7. An LDD region 9 is formed on the semiconductor substrate 2 between the first source/drain diffusion layer 3 and the memory gate 6.

As shown in FIG. 16, the control gate 5 and the memory gate 6 are formed inside of the trench formed on the semiconductor substrate 2. Also, the first source/drain diffusion layer 3 is formed inside of the trench, and the second source/drain diffusion layer 4 is formed outside of the trench.

A gate insulating film 8 is formed between the control gate 5 and the semiconductor substrate 2. The charge storage layer (ONO film) 7 is formed between the memory gate 6 and the semiconductor substrate 2. The charge storage layer (ONO film) 7 is also formed between the memory gate 6 and the control gate 5. A side wall 15 is formed on a side surface of the second source/drain diffusion layer 4 side of the control gate 5. Also, a control gate silicide 12 is formed on the second source/drain diffusion layer 4. A second diffusion layer silicide 12 is formed on the second source/drain diffusion layer 4. A cell side wall 14 extends from the side surface of the first source/drain diffusion layer 3 side of the memory gate 6 toward the upper surface thereof. Then, a first diffusion layer silicide 11 is so formed as to cover the upper surface and the side surface of the memory gate 6 along the cell side wall 14.

Figure 17:
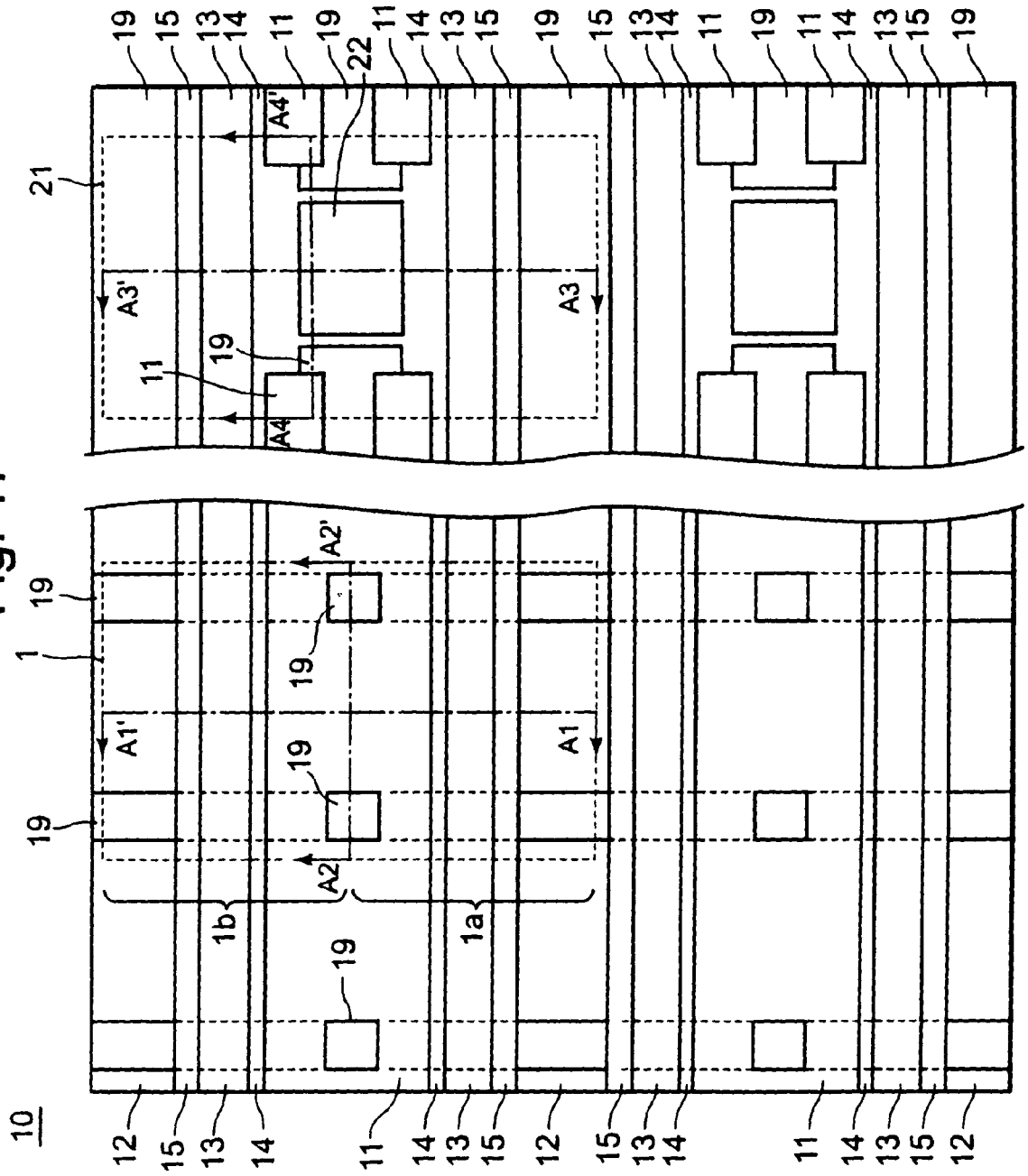
FIG. 17 is a plan view illustrating a configuration of the semiconductor device 10 according to the second exemplary embodiment.

FIG. 17 is a plan view exemplifying a configuration of the semiconductor device 10 according to the second exemplary embodiment which is viewed from the upper surface. Each of the plurality of memory elements 1 disposed in the semiconductor device 10 includes two memory cells (i.e., first memory cell 1a, second memory cell 1b). In the second exemplary embodiment, the first memory cell 1a and the second memory cell 1b are symmetrical with each other with the same structure. Accordingly, hereinafter, a description of portions where the first memory cell 1a and the second memory cell 1b are duplicated will be omitted. In the second exemplary embodiment, the configuration and operation will be described in correspondence with the first memory cell 1a.

Referring to FIG. 17, the semiconductor device 10 includes a memory element region in which the memory elements 1 are arranged in an array, and a contact region 21 in which a contact (i.e., memory gate contact 23, not shown) connected to the memory gate 6 is formed. As shown in FIG. 17, the plurality of memory elements 1 arranged in the semiconductor device 10 is separated respectively by element isolation regions 19 that extend along a first direction. The gates (i.e., the control gates 5, the memory gates 6) of the plurality of memory elements 1 are configured along a second direction perpendicular to the first direction. Also, the contact region 21 is configured to include the element isolation regions 19. As shown in FIG. 17, the contact region 21 includes the memory gate silicide 22. The memory silicide 22 is formed on the element isolation region 19. The memory gate silicide 22 is connected with a memory gate contact 23 (not shown) which will be described later.

Figure 18:
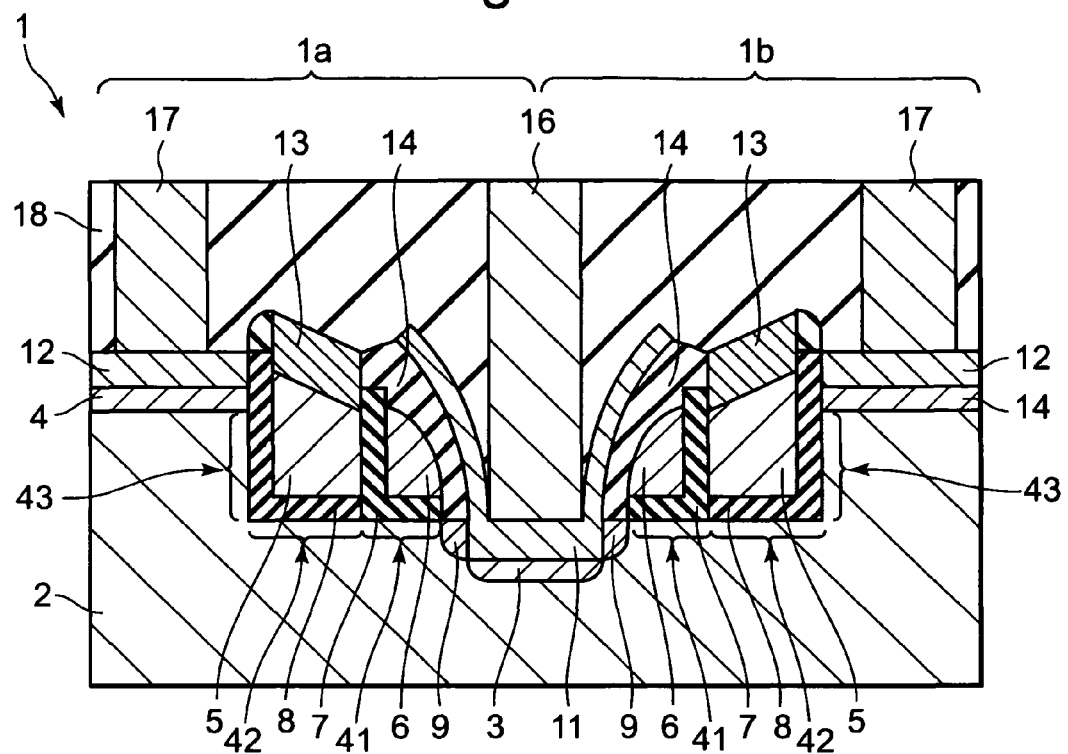
FIG. 18 is a cross-sectional view illustrating a configuration of a cross-section along A1-A1' of FIG. 17.

FIG. 18 is a cross-sectional view exemplifying the configuration of a cross section of the memory element 1 according to the second exemplary embodiment. FIG. 18 exemplifies the configuration of the cross section of the above-mentioned semiconductor device 10 shown in FIG. 2 which is cut at a position indicated by A1-A1'. As shown in FIG. 18, the memory element 1 according to the second exemplary embodiment includes the first source/drain diffusion layer 3 configured inside of the trench, and the second source/drain diffusion layer 4 configured outside of the trench. The control gate 5 and the memory gate 6 are formed inside of the trench.

A first channel region 41 below the memory gate 6, a second channel region 42 below the control gate 5, and a third channel region 43 on a side surface of the control gate 5 are formed between the first source/drain diffusion layer 3 and the second source/drain diffusion layer 4. The side surface of the control gate 5 faces the side surface of the trench through the gate insulating film 8 formed along a vertical direction. The first source/drain diffusion layer 3 is connected to the first source/drain contact 16 through the first diffusion layer silicide 11. The first diffusion layer silicide 11 is so formed as to cover the side surface and upper surface of the memory gate 6 through the cell side wall 14, and is connected to the first source/drain diffusion layer 3 through no polysilicon.

Also, a side wall is formed on the side surface of the second source/drain diffusion layer 4 side of the control gate silicide 13. The second diffusion layer silicide 12 is formed on the second source/drain diffusion layer 4 outside of the side wall. The second source/drain diffusion layer 4 is connected to the second source/drain contact 17 through the second diffusion layer silicide 12.

Figure 19:
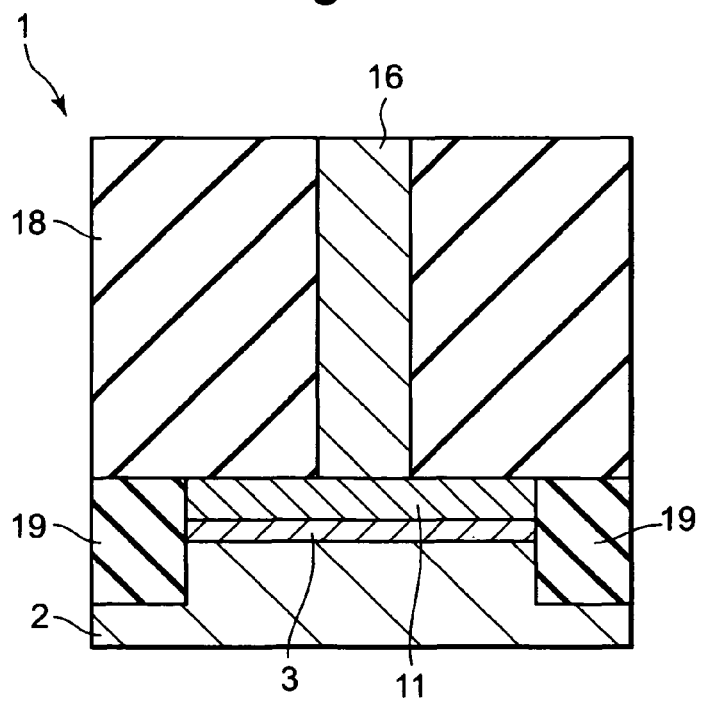
FIG. 19 is a cross-sectional view illustrating a configuration of another cross-section along A2-A2' of FIG. 17.

FIG. 19 is a cross-sectional view exemplifying the configuration of the cross section of the semiconductor device 10 according to the second exemplary embodiment. FIG. 19 exemplifies the configuration of the cross section of the semiconductor device 10 according to the second exemplary embodiment, which is cut at a position indicated by A2-A2' of FIG. 17. As shown in FIG. 19, the first source/drain diffusion layer 3 is formed on the semiconductor substrate 2 between the element isolation regions 19. The first diffusion layer silicide 11 is also formed between the element isolation regions 19 as with the first source/drain diffusion layer 3. The first source/drain contact 16 is formed in a contact hole that penetrates through an interlayer insulating film 18.

Figure 20:
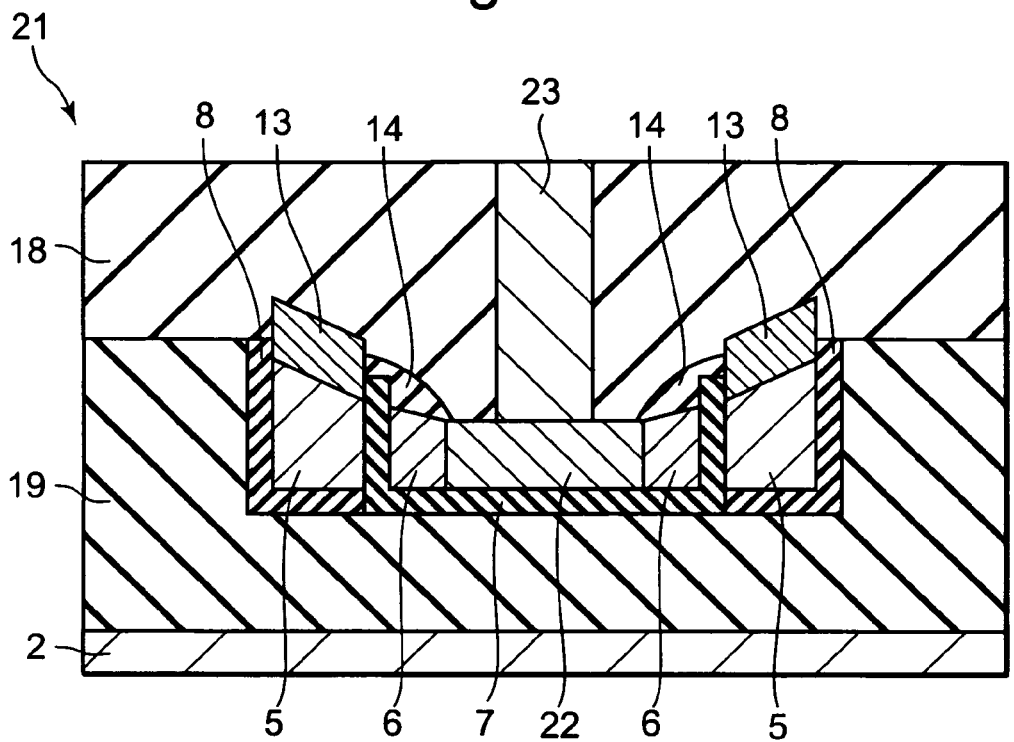
FIG. 20 is a cross-sectional view illustrating a configuration of a cross-section along A3-A3' of FIG. 17.

FIG. 20 is a cross-sectional view exemplifying the configuration of the cross section of the contact region 21. FIG. 20 exemplifies the configuration of the contact region 21 according to the second exemplary embodiment, which is cut at a position indicated by A3-A3' of FIG. 17. As shown in FIG. 20, in the contact region 21 according to the second exemplary embodiment, the memory gate silicide 22 is formed inside of the trench. Also, the contact region 21 has a symmetrical structure as in the first exemplary embodiment.

The contact region 21 is formed on the element isolation region 19 formed on the semiconductor substrate 2. The memory gate silicide 22 of the contact region 21 is connected to two opposite memory gates 6. One of the memory gates 6 is connected to the memory gate 6 of the first memory cell 1a. The other memory gate 6 is connected to the memory gate 6 of the second memory cell 1b. The upper surface of the memory gate 6 included in the contact region 21 is covered with the cell side wall 14. Also, the charge storage layer (ONO film) 7 is formed between the memory gate 6 and the element isolation region 19, and the charge storage layer (ONO film) 7 is also formed between the memory gate silicide 22 and the element isolation region 19. The memory gate contact 23 connected to the memory gate silicide 22 is formed into the contact hole that penetrates through the interlayer insulating film 18.

Figure 21:
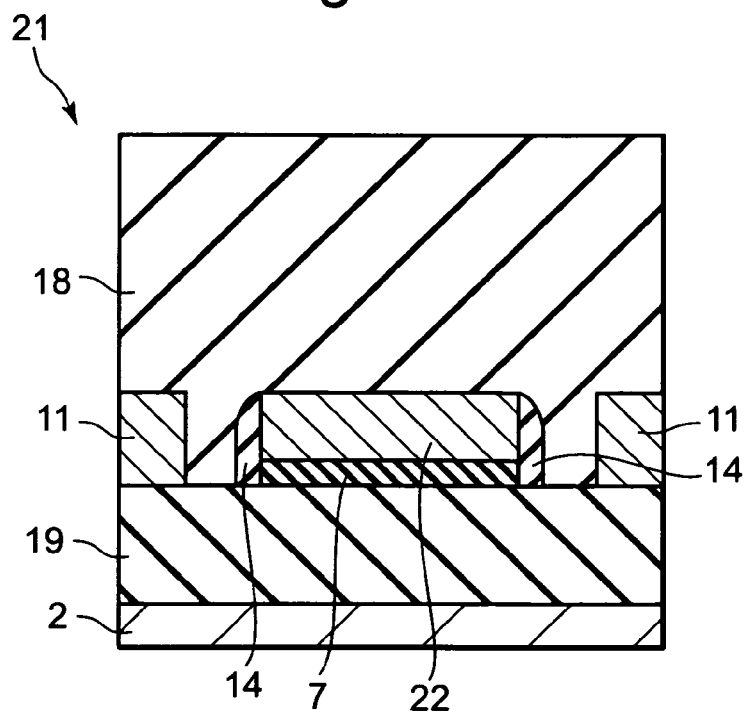
FIG. 21 is a cross-sectional view illustrating a configuration of another cross-section along A4-A4' of FIG. 17.

FIG. 21 is a cross-sectional view exemplifying the configuration of the cross section of the contact region 21. FIG. 21 exemplifies the configuration of the contact region 21 according to the second exemplary embodiment, which is cut at a position indicated by A4-A4' of FIG. 17. As shown in FIG. 21, the cell side wall 14 is formed on the side surface of the memory gate silicide 22 in the contact region 21.

In order to read information written in the memory element 1 at a high speed, it is preferable that a difference (or ratio) between the current flowing in a write state and a current flowing in an erase state is large. As described above, in the second exemplary embodiment, the first source/drain contact 16 is connected to the first diffusion layer silicide 11, and the first diffusion layer silicide 11 is connected to the first source/drain diffusion layer 3 through no polysilicon. For that reason, it is possible to suppress an increase in the resistance of the first source/drain contact 16 and the first source/drain diffusion layer 3 corresponding to miniaturization. The memory element 1 according to the second exemplary embodiment can configure the memory cell that operates at a high speed while reducing the area by increasing the current of the erase state (on-state current).

Also, as described above, the memory element 1 according to the second exemplary embodiment includes a control gate 5 inside of the trench formed on the semiconductor substrate 2, and the second source/drain diffusion layer 4 formed outside of the trench. A step is formed between the control gate 5 and the second source/drain diffusion layer 4, and the side surface of the trench acts as the channel region. As a result, even if the substantial width of the control gate 5 is thinned, the gate length sufficient to suppress the malfunction is configured. In the memory element 1 according to the second exemplary embodiment, the side surface of the trench is configured as a channel region corresponding to the control gate 5. In other words, the side surface of the trench is so configured as not to be affected by the memory gate 6. With that configuration, the memory element 1 according to the second exemplary embodiment can shorten the length of the channel region below the memory gate 6, and ensure the high ON current.

Also, the memory element 1 according to the second exemplary embodiment includes the memory gate 6 and the charge storage layer (ONO film) 7 inside of the trench. With that configuration, even if the channel region below the control gate 5 is sufficiently inverted, the first source/drain diffusion layer 3 can be prevented from being punched through a deeper portion of the channel of the memory gate 6. For that reason, the memory element 1 according to the second exemplary embodiment can thin the substantial width of the memory gate 6, and reduce the area used for the memory cell.

Further, the first diffusion layer silicide 11 covers the upper surface and the side surface of the memory gate 6 along the cell side wall 14. With that configuration, even if the position of the contact hole is displaced from the position at the design stage, at the manufacturing stage of the contact hole for forming the first source/drain contact 16, as with the memory element 1 according to the first exemplary embodiment, it is possible to suppress the occurrence of such a trouble that the memory gate 6 and the first source/drain diffusion layer 3 are short-circuited.

Hereinafter, a description will be given of a manufacturing process for manufacturing the semiconductor device 10 according to the second exemplary embodiment. The semiconductor device 10 according to the second exemplary embodiment includes the plurality of memory elements 1 and the plurality of contact regions 21. The plurality of memory elements 1 and the contact regions 21 are formed at the same time. Also, the plurality of memory elements 1 and the contact regions 21 are formed at locations apart from each other. Hereinafter, a portion between the location (hereinafter referred to as (a "memory element region") in which the memory element 1 is formed, and the location (hereinafter referred to as (a "contact region") in which the contact region 21 is formed, is omitted, and a description of the manufacturing process of the semiconductor device 10 will be described.

Figure 22A:
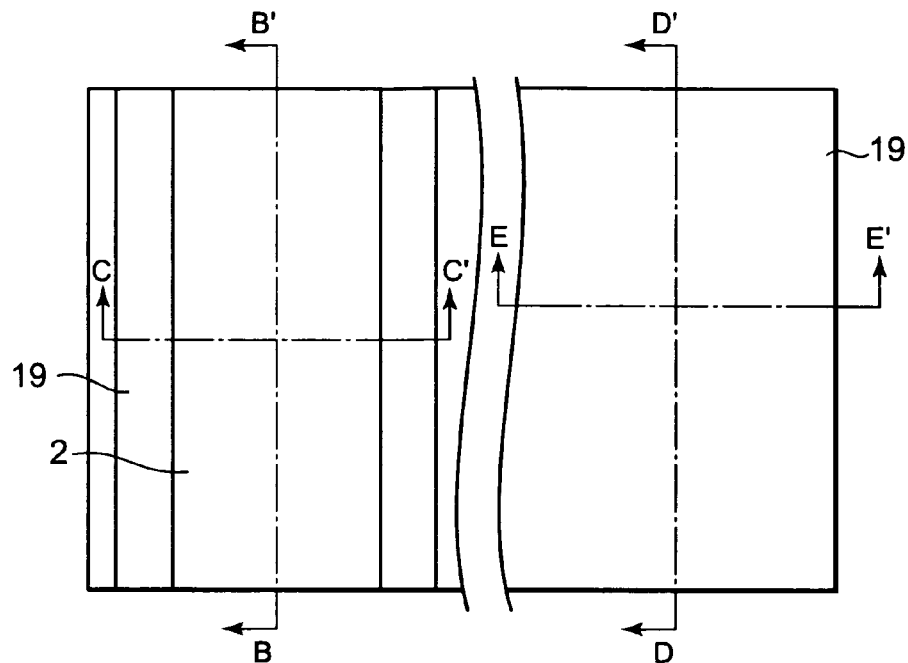
FIG. 22A is a plan view illustrating a first step of a manufacturing for the semiconductor device 10 according to the second exemplary embodiment.
Figure 22B:
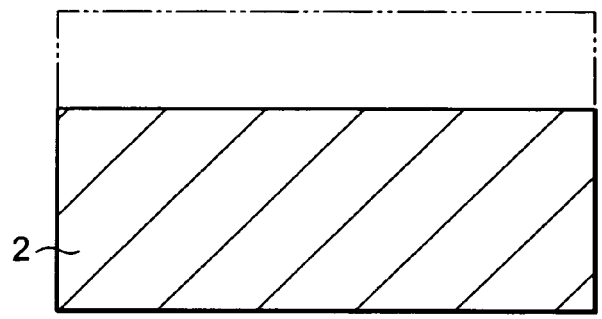
FIG. 22B is a cross-sectional view illustrating the first step of the manufacturing for a cross-section along B-B' of FIG. 22A.
Figure 22C:
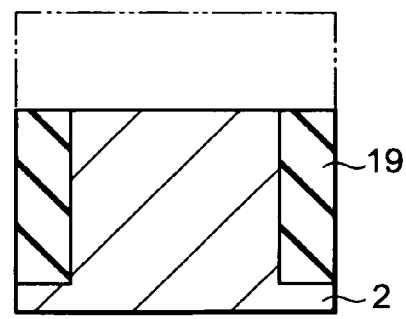
FIG. 22C is a cross-sectional view illustrating the first step of the manufacturing for a cross-section along C-C' of FIG. 22A.
Figure 22D:
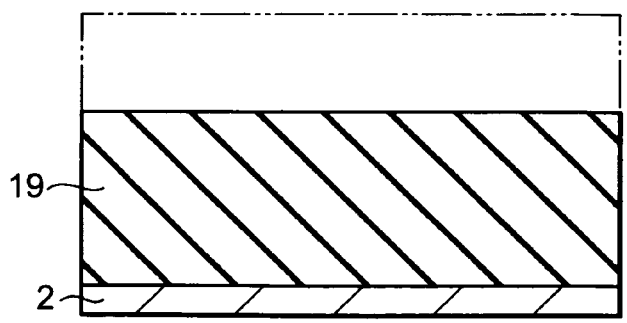
FIG. 22D is a cross-sectional view illustrating the first step of the manufacturing for a cross-section along D-D' of FIG. 22A.
Figure 22E:
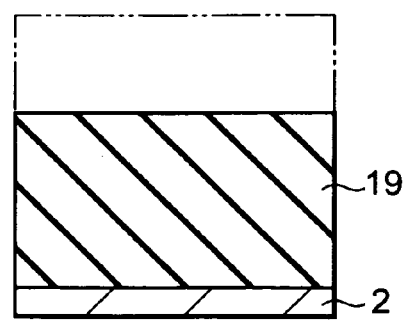
FIG. 22E is a cross-sectional view illustrating the first step of the manufacturing for a cross-section along E-E' of FIG. 22A.

FIGS. 22A to 22E are diagrams exemplifying a state of a first process for manufacturing the memory element 1 according to the second exemplary embodiment. FIG. 22A is a plan view of a semiconductor material in the first process, which is viewed from above. FIG. 22B is a cross-sectional view exemplifying a cross section (hereinafter referred to as "B-B' cross section") of the semiconductor material, which is cut at a position B-B' shown in FIG. 22A. FIG. 22C is a cross-sectional view exemplifying a cross section (hereinafter referred to as "C-C' cross section") of the semiconductor material, which is cut at a position C-C' shown in FIG. 22A. FIG. 22D is a cross-sectional view exemplifying a cross section (hereinafter referred to as "D-D' cross section") of the semiconductor material, which is cut at a position D-D' shown in FIG. 22A. FIG. 22E is a cross-sectional view exemplifying a cross section (hereinafter referred to as "E-E' cross section") of the semiconductor material, which is cut at a position E-E' shown in FIG. 22A. As shown in FIGS. 22A to 22E, in the first process, the element isolation region 19 is formed on the semiconductor substrate 2.

Figure 23A:
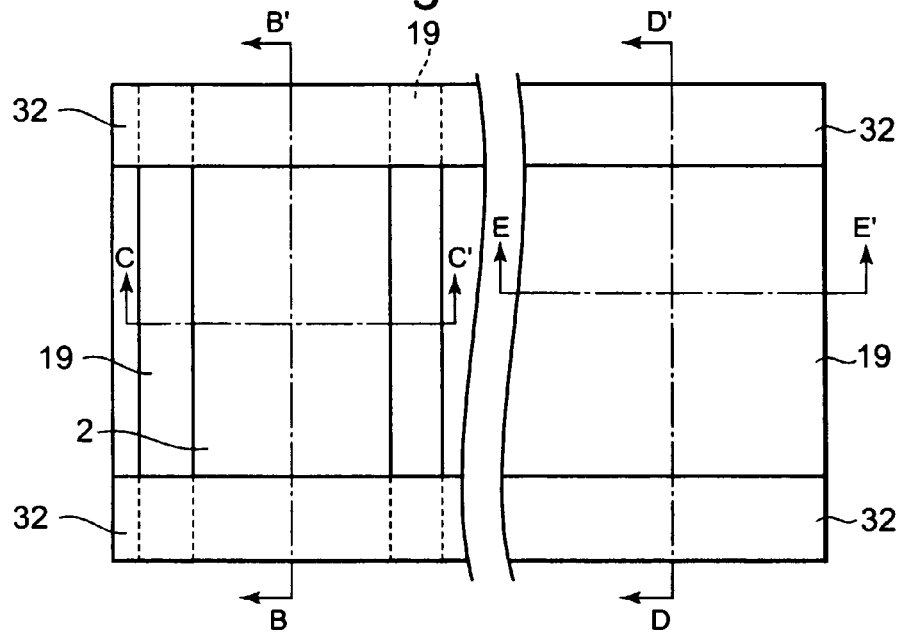
FIG. 23A is a plan view illustrating a second step of a manufacturing for the semiconductor device 10 according to the second exemplary embodiment.
Figure 23B:
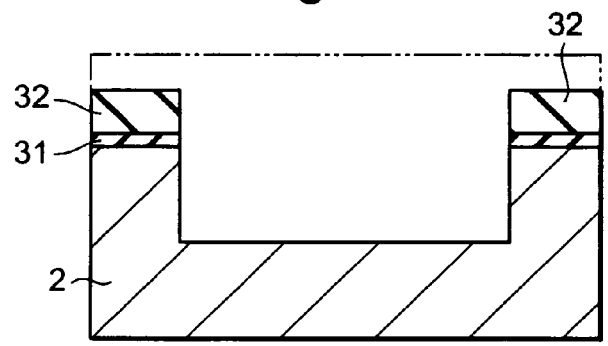
FIG. 23B is a cross-sectional view illustrating the second step of the manufacturing for a cross-section along B-B' of FIG. 23A.
Figure 23C:
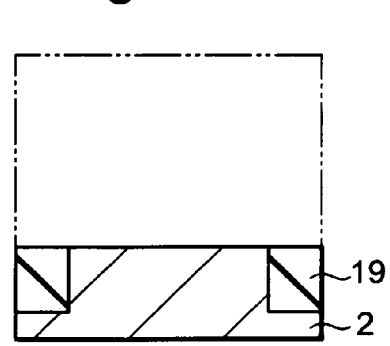
FIG. 23C is a cross-sectional view illustrating the second step of the manufacturing for a cross-section along C-C' of FIG. 23A.
Figure 23D:
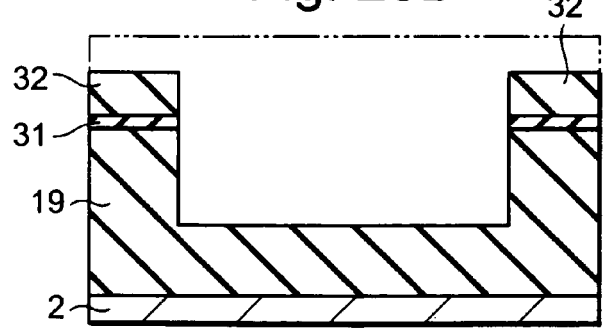
FIG. 23D is a cross-sectional view illustrating the second step of the manufacturing for a cross-section along D-D' of FIG. 23A.
Figure 23E:
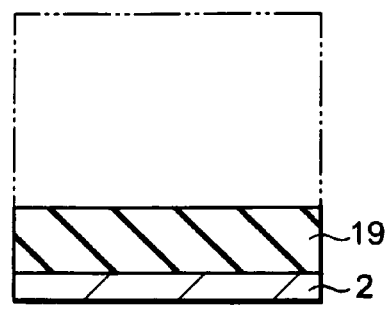
FIG. 23E is a cross-sectional view illustrating the second step of the manufacturing for a cross-section along E-E' of FIG. 23A.

FIGS. 23A to 23E are diagrams exemplifying a state of a second process for manufacturing the memory element 1 according to the second exemplary embodiment. FIG. 23A is a plan view of a semiconductor material in the second process, which is viewed from above. FIG. 23B is a cross-sectional view exemplifying the configuration of a cross section B-B'. FIG. 23C is a cross-sectional view exemplifying the configuration of a cross section C-C'. FIG. 23D is a cross-sectional view exemplifying the configuration of a cross section D-D'. FIG. 23E is a cross-sectional view exemplifying the configuration of a cross section E-E'.

As shown in FIGS. 23B and 23D, in the second process, an oxide film 31 and a nitride film 32 are formed in order so as to cover the element isolation region 19 and the semiconductor substrate 2. After a resist (not shown) of a given pattern has been formed on the nitride film 32, the nitride film 32 and the oxide film 31 are selectively removed with the resist as a mask.

As shown in FIG. 23B, in the second process, an opening portion is defined between the nitride film 32 and the oxide film 31 in the memory element region, and the trench is formed on the semiconductor substrate 2 at a position corresponding to the opening portion. Also, as shown in FIG. 22C, in the second process, the element isolation region 19 is ground (e.g., thinned) so as to have the same height as the surface of the semiconductor substrate 2 of the trench bottom portion in the memory element region. At this time, in the contact region, the trench is formed in the element isolation region 19 as with the semiconductor substrate 2. Accordingly, as shown in FIGS. 23D and 23E, in the contact region, the element isolation region 19 having the trench is formed in the opening portion between the nitride film 32 and the oxide film 31.

Figure 24A:
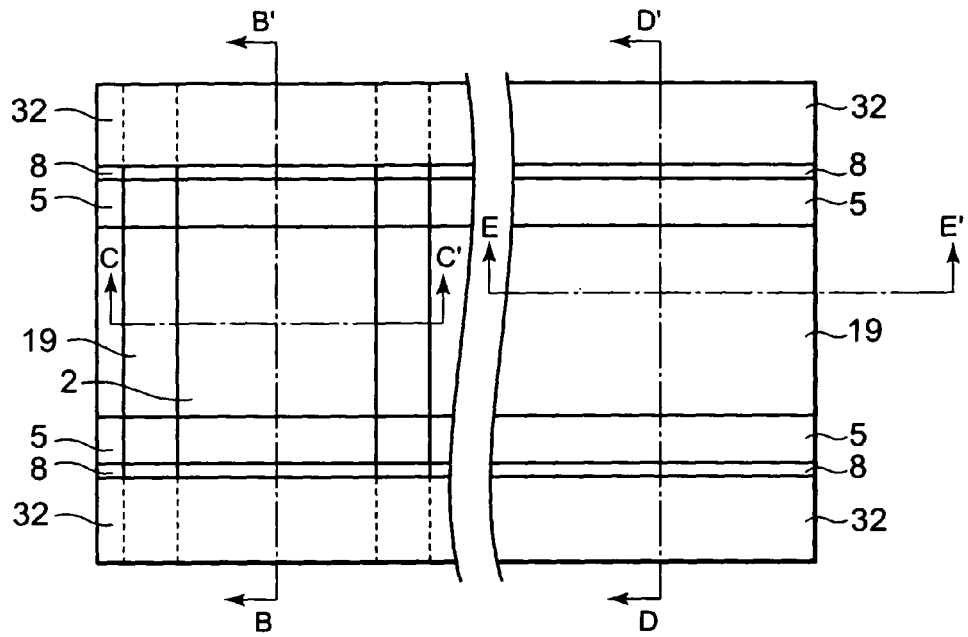
FIG. 24A is a plan view illustrating a third step of a manufacturing for the semiconductor device 10 according to the second exemplary embodiment.
Figure 24B:
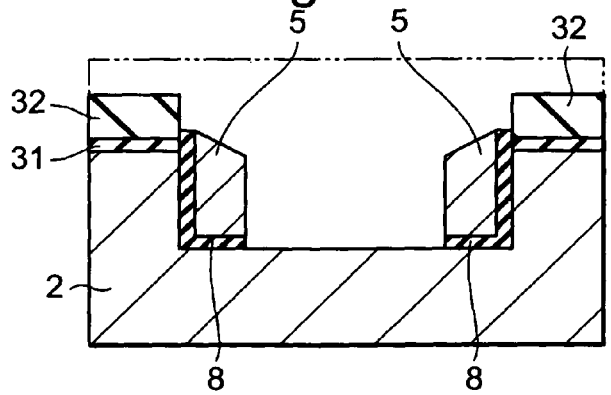
FIG. 24B is a cross-sectional view illustrating the third step of the manufacturing for a cross-section along B-B' of FIG. 24A.
Figure 24C:
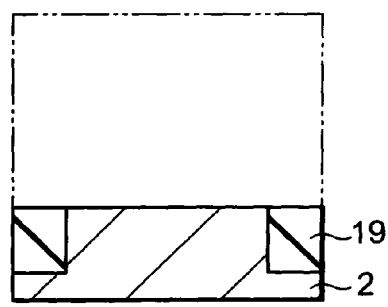
FIG. 24C is a cross-sectional view illustrating the third step of the manufacturing for a cross-section along C-C' of FIG. 24A.
Figure 24D:
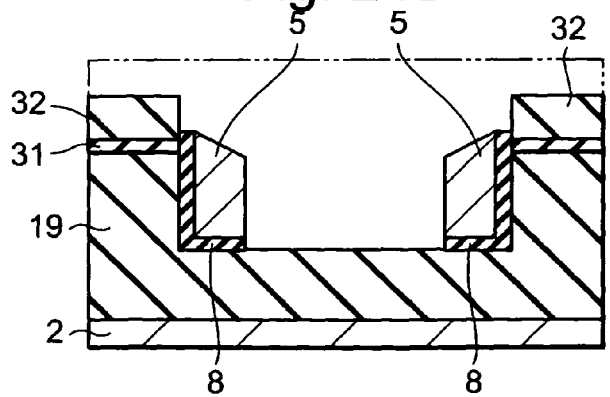
FIG. 24D is a cross-sectional view illustrating the third step of the manufacturing for a cross-section along D-D' of FIG. 24A.
Figure 24E:
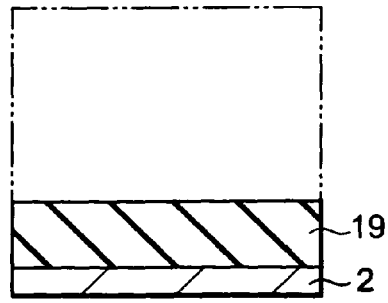
FIG. 24E is a cross-sectional view illustrating the third step of the manufacturing for a cross-section along E-E' of FIG. 24A.

FIGS. 24A to 24E are diagrams showing a state of a third process for manufacturing the memory element 1 according to the second exemplary embodiment. FIG. 24A is a plan view of a semiconductor material of the third process, which is viewed from above. FIG. 24B is a cross-sectional view exemplifying the configuration of a cross section B-B'. FIG. 24C is a cross-sectional view exemplifying the configuration of a cross section C-C'. FIG. 24D is a cross-sectional view exemplifying the configuration of a cross section D-D'. FIG. 24E is a cross-sectional view exemplifying the configuration of a cross section E-E'.

In the third process, an oxide film being the gate insulating film 8 is formed on the surface of the semiconductor substrate 2 inside of the trench, and the surface of the nitride film 32, and a polysilicon film being the control gate 5 is formed thereon. Thereafter, after the polysilicon is etched back to form the control gate 5 being in the form of a side wall, a surplus oxide film is removed to form the gate insulating film 8.

As shown in FIGS. 24B and 24C, the control gate 5 and the gate insulating film 8 are symmetrically formed inside of the trench in the memory element region in the third process. Also, the semiconductor substrate 2 between the opposite control gates 5 is exposed. In this situation, the semiconductor substrate 2 between the opposite control gates 5 is exposed. Also, as shown in FIGS. 24D and 24E, the control gate 5 and the gate insulating film 8 are symmetrically formed inside of the trench in the control region in the third process, and the element isolation region 19 between the opposite control gates 5 is exposed.

Figure 25A:
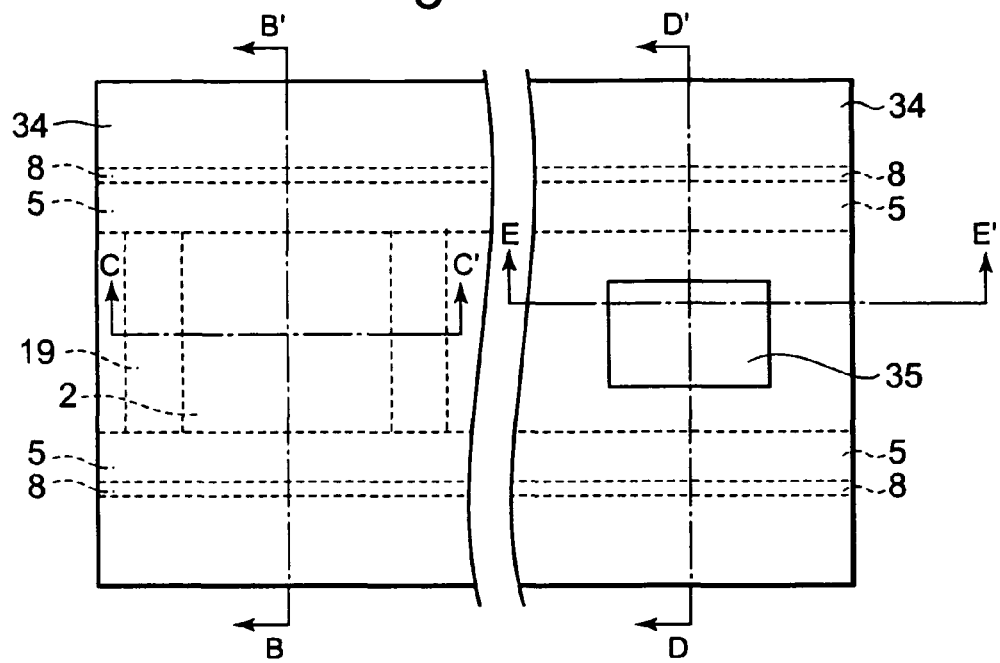
FIG. 25A is a plan view illustrating a fourth step of a manufacturing for the semiconductor device 10 according to the second exemplary embodiment.
Figure 25B:
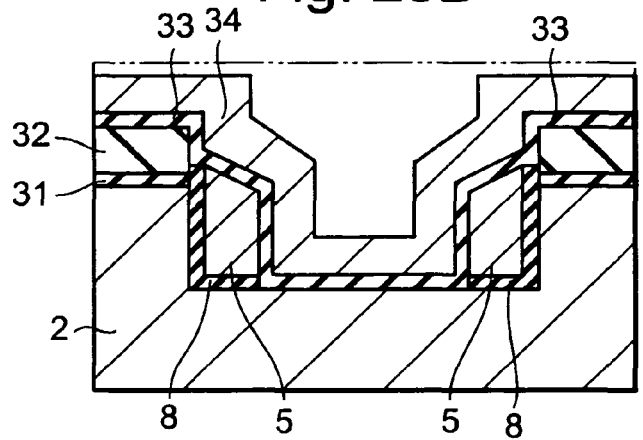
FIG. 25B is a cross-sectional view illustrating the fourth step of the manufacturing for a cross-section along B-B' of FIG. 25A.
Figure 25C:
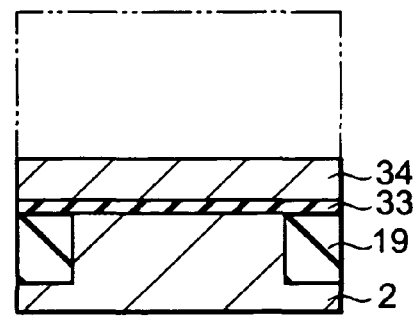
FIG. 25C is a cross-sectional view illustrating the fourth step of the manufacturing for a cross-section along C-C' of FIG. 25A.
Figure 25D:
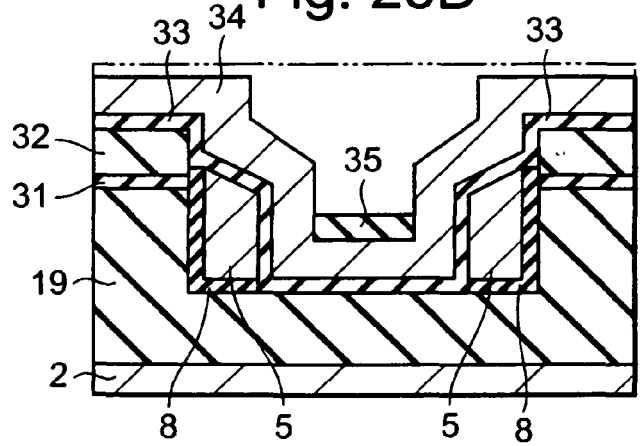
FIG. 25D is a cross-sectional view illustrating the fourth step of the manufacturing for a cross-section along D-D' of FIG. 25A.
Figure 25E:
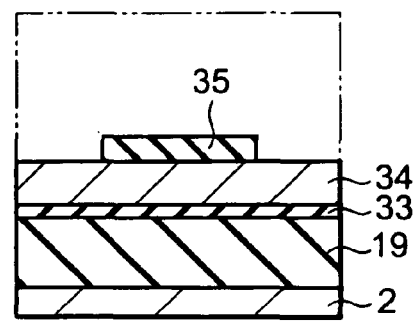
FIG. 25E is a cross-sectional view illustrating the fourth step of the manufacturing for a cross-section along E-E' of FIG. 25A.

FIGS. 25A to 25E are diagrams exemplifying a state of a fourth process for manufacturing the memory element 1 according to the second exemplary embodiment. FIG. 25A is a plan view of a semiconductor material of the fourth process, which is viewed from above. FIG. 25B is a cross-sectional view exemplifying the configuration of a cross section B-B'. FIG. 25C is a cross-sectional view exemplifying the configuration of a cross section C-C'. FIG. 25D is a cross-sectional view exemplifying the configuration of a cross section D-D'. FIG. 25E is a cross-sectional view exemplifying the configuration of a cross section E-E'.

As shown in FIGS. 25B to 25E, in the fourth process, after a charge storage film (ONO film) 33 being the charge storage layer (ONO film) 7 has been formed, a memory gate polysilicon film 34 being the memory gate 6 is formed thereon. As shown in FIG. 25A, in the contact region, in the fourth process, a first proactive oxide film 35 is further formed on the memory gate polysilicon film 34.

As shown in FIG. 25B, in the B-B' cross section of the memory element region is formed the charge storage film (ONO film) 33 that covers the surface of the semiconductor substrate 2 exposed inside of the trench, the side surface and the upper surface of the control gate 5, and the side surface and the upper surface of the nitride film 32. The memory gate polysilicon film 34 is formed on the charge storage film (ONO film) 33. The memory gate polysilicon film 34 is so formed as to provide an opening portion. As shown in FIG. 25C, in the C-C' cross section, the charge storage film (ONO film) 33 and the memory gate polysilicon film 34 are also formed on the element isolation region 19.

As shown in FIG. 25D, in the D-D' cross section of the contact region is formed the charge storage film (ONO film) 33 that covers the surface of the element isolation region 19 that has been exposed inside of the trench, the side surface and the upper surface of the control gate 5, and the side surface and the upper surface of the nitride film 32. The memory gate polysilicon film 34 is then formed on the charge storage film (ONO film) 33. The memory gate polysilicon film 34 is so formed as to provide an opening portion. The first protective oxide film 35 is so formed as to cover the bottom surface of the opening portion. As shown in FIG. 25E, the first protective oxide film 35 is formed so as to correspond to a portion in which the memory gate silicide 22 is formed in a subsequent process.

Figure 26A:
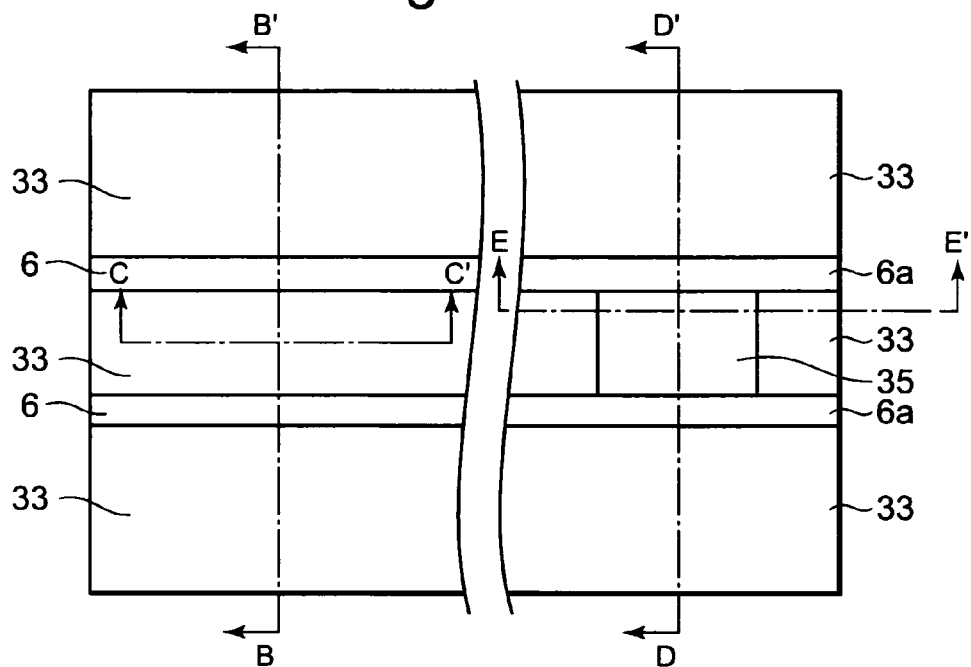
FIG. 26A is a plan view illustrating a fifth step of a manufacturing for the semiconductor device 10 according to the second exemplary embodiment.
Figure 26B:
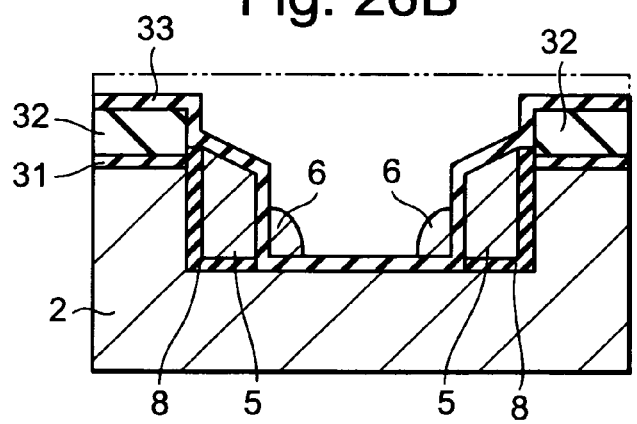
FIG. 26B is a cross-sectional view illustrating the fifth step of the manufacturing for a cross-section along B-B' of FIG. 26A.
Figure 26C:
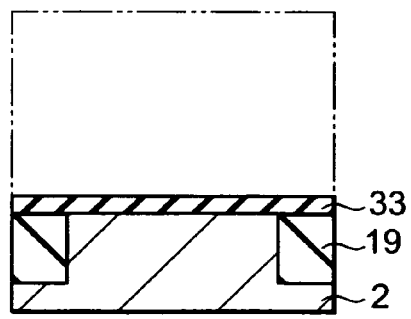
FIG. 26C is a cross-sectional view illustrating the fifth step of the manufacturing for a cross-section along C-C' of FIG. 26A.
Figure 26D:
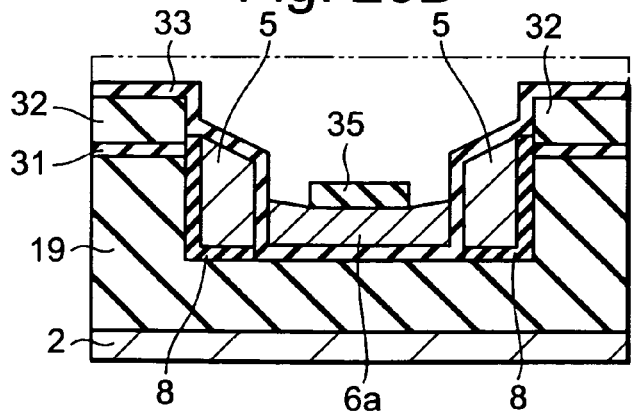
FIG. 26D is a cross-sectional view illustrating the fifth step of the manufacturing for a cross-section along D-D' of FIG. 26A.
Figure 26E:
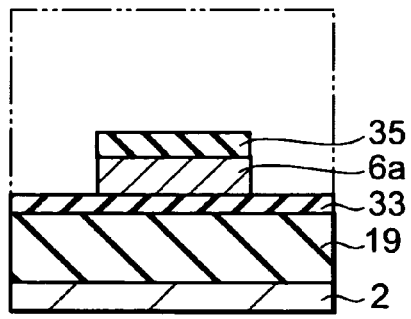
FIG. 26E is a cross-sectional view illustrating the fifth step of the manufacturing for a cross-section along E-E' of FIG. 26A.

FIGS. 26A to 26E are diagrams exemplifying a state of a fifth process for manufacturing the memory element 1 according to the second exemplary embodiment. FIG. 26A is a plan view of a semiconductor material of the fifth process, which is viewed from above. FIG. 26B is a cross-sectional view exemplifying the configuration of a cross section B-B'. FIG. 26C is a cross-sectional view exemplifying the configuration of a cross section C-C'. FIG. 26D is a cross-sectional view exemplifying the configuration of a cross section D-D'. FIG. 26E is a cross-sectional view exemplifying the configuration of a cross section E-E'.

As shown in FIGS. 26A and 26B, in the fifth process, the memory gate polysilicon film 34 is etched back to form the memory gate 6. As shown in FIG. 26B, in the B-B' cross section of the memory element region, the opposite two memory gates 6 are formed inside of the trench. The charge storage film (ONO film) 33 is exposed between the opposite memory gates 6 in the B-B' cross section. As shown in FIG. 26C, in the C-C' cross section, the charge storage film (ONO film) 33 that covers the element isolation region 19 and the surface of the semiconductor substrate 2 remains.

As shown in FIG. 26D, in the D-D' cross section of the contact region, the memory gate polysilicon film 34 being a memory gate contact region 6a remains below the first protective oxide film 35 inside of the trench. Also, the memory gate polysilicon film 34 also remains on the side of the control gate 5. As shown in FIG. 26E, in the E-E' cross section, the memory gate contact region 6a is formed below the first protective oxide film 35, and the memory gate polysilicon film 34 of other portions is removed.

Figure 27A:
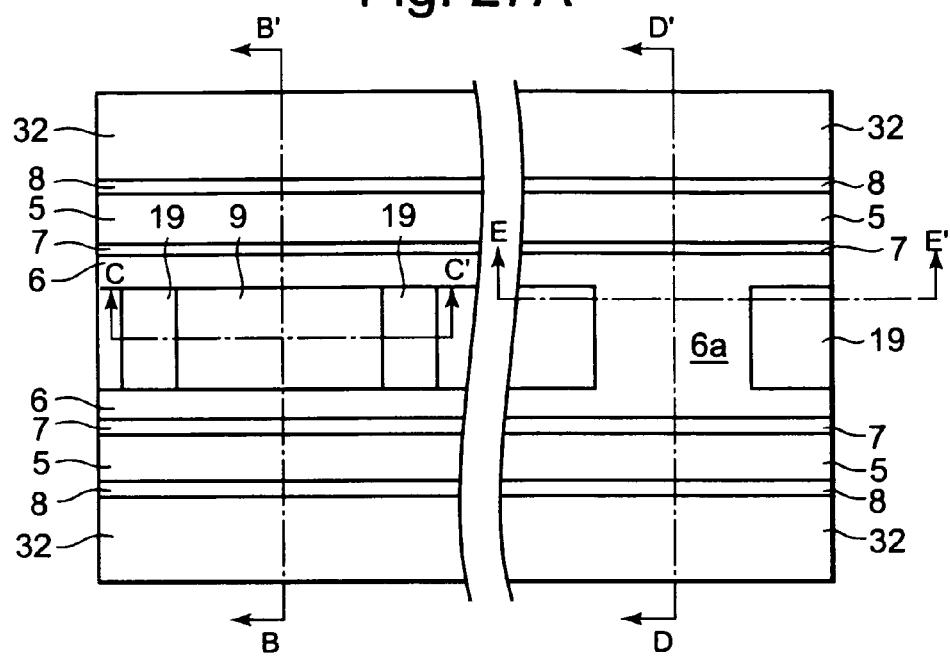
FIG. 27A is a plan view illustrating a sixth step of a manufacturing for the semiconductor device 10 according to the second exemplary embodiment.
Figure 27B:
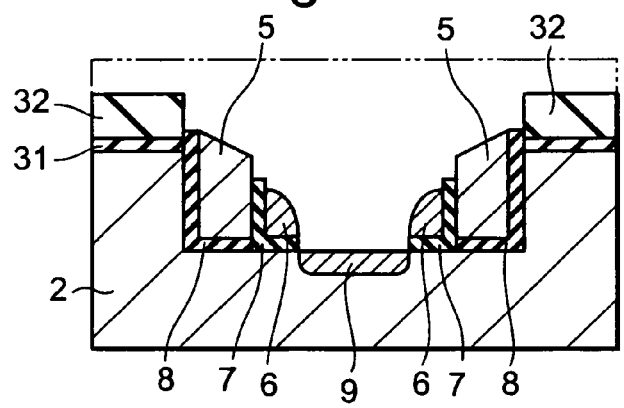
FIG. 27B is a cross-sectional view illustrating the sixth step of the manufacturing for a cross-section along B-B' of FIG. 27A.
Figure 27C:
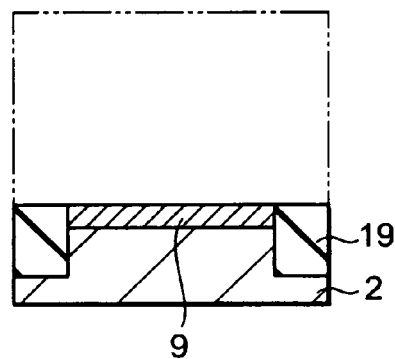
FIG. 27C is a cross-sectional view illustrating the sixth step of the manufacturing for a cross-section along C-C' of FIG. 27A.
Figure 27D:
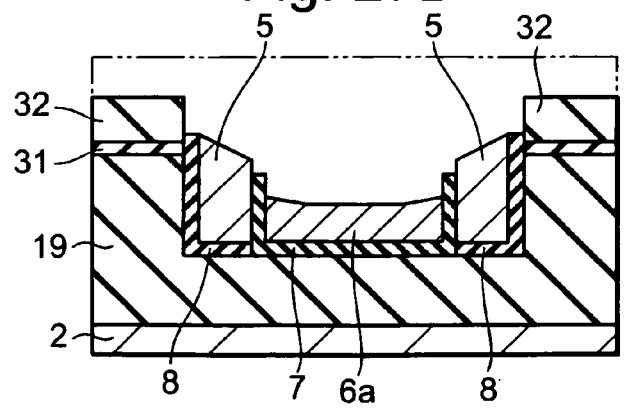
FIG. 27D is a cross-sectional view illustrating the sixth step of the manufacturing for a cross-section along D-D' of FIG. 27A.
Figure 27E:
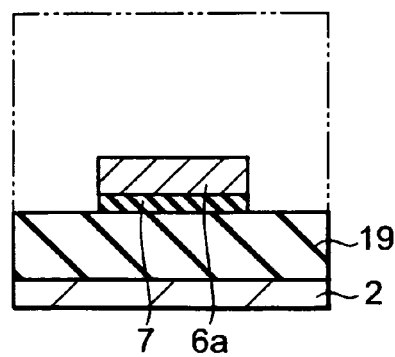
FIG. 27E is a cross-sectional view illustrating the sixth step of the manufacturing for a cross-section along E-E' of FIG. 27A.

FIGS. 27A to 27E is a diagram exemplifying a state of a sixth process for manufacturing the memory element 1 according to the second exemplary embodiment. FIG. 27A is a plan view of a semiconductor material of the sixth process, which is viewed from above. FIG. 27B is a cross-sectional view exemplifying the configuration of a cross section B-B'. FIG. 27C is a cross-sectional view exemplifying the configuration of a cross section C-C'. FIG. 27D is a cross-sectional view exemplifying the configuration of a cross section D-D'. FIG. 27E is a cross-sectional view exemplifying the configuration of a cross section E-E'.

As shown in FIGS. 27A to 27E, in the sixth process, the charge storage film (ONO film) 33 exposed inside of the trench is selectively removed with the memory gate 6 as a mask. With that configuration, the charge storage layer (ONO film) 7 is formed below the memory gate 6. Thereafter, impurities (for example, As of about 1E14/cm²) are implanted into the exposed semiconductor substrate 2 to form the diffusion layer being the LDD region 9 on the trench bottom surface. In this situation, the first protective oxide film 35 formed on the memory gate contact region 6a is removed in the contact region.

As shown in FIG. 27B, in the sixth process, in the B-B' cross section, the charge storage film (ONO film) 33 that covers the control gate 5 and the nitride film 32 is removed. In this situation, the charge storage film (ONO film) 33 formed between the control gate 5 and the memory gate 6 electrically isolates the remaining control gate 5 and the memory gate 6 from each other. As shown in FIG. 27C, in the C-C' cross section, the LDD region 9 is formed between the element isolation regions 19. As shown in FIG. 27D, in the D-D' cross section, the first protective oxide film 35 is removed to expose the surface of the memory gate contact region 6a. Also, the charge storage film (ONO film) 33 that covers the control gate 5 and the nitride film 32 is removed while the charge storage film (ONO film) 33 remains below the memory gate contact region 6a. With that configuration, a film having the same configuration as that of the charge storage layer (ONO film) 7 is formed. As shown in FIG. 27E, in the E-E' cross section, the first protective oxide film 35 and the charge storage film (ONO film) 33 are removed to expose the surface of the memory gate contact region 6a and the surface of the element isolation region 19.

Figure 28A:
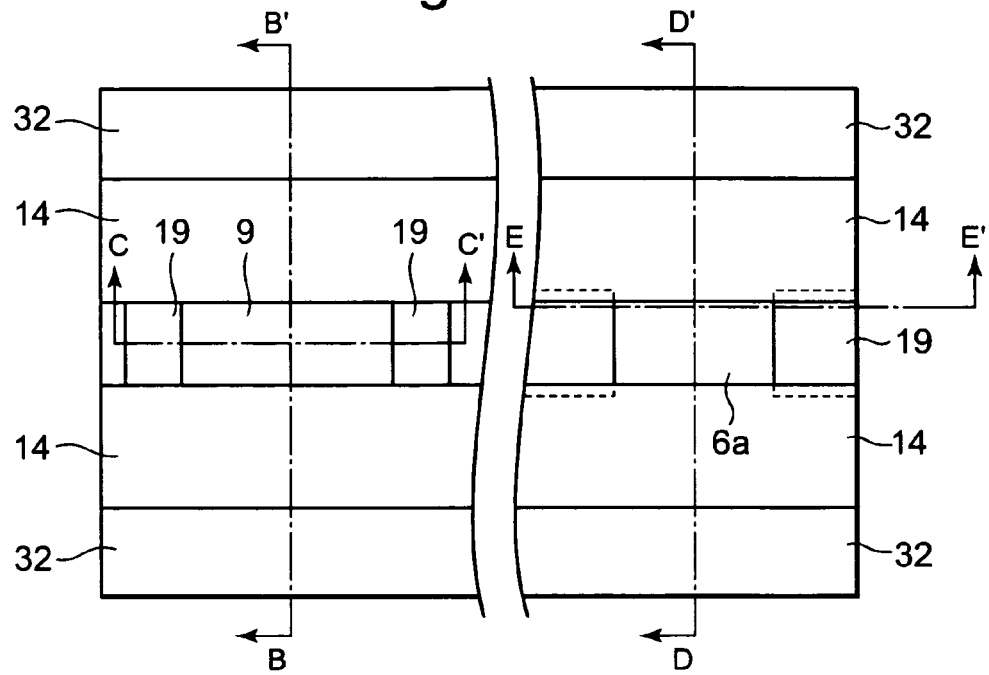
FIG. 28A is a plan view illustrating a seventh step of a manufacturing for the semiconductor device 10 according to the second exemplary embodiment.
Figure 28B:
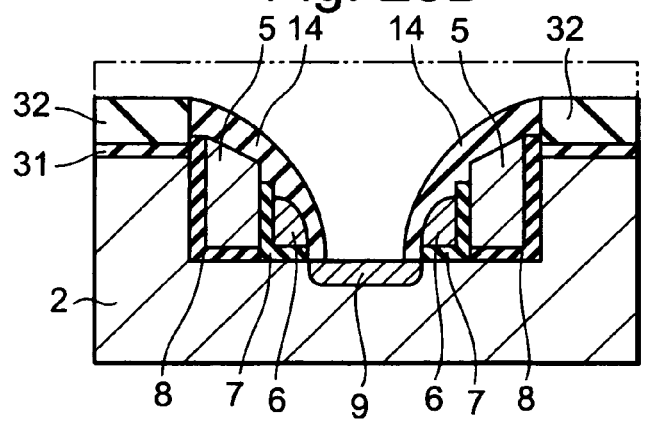
FIG. 28B is a cross-sectional view illustrating the seventh step of the manufacturing for a cross-section along B-B' of FIG. 28A.
Figure 28C:
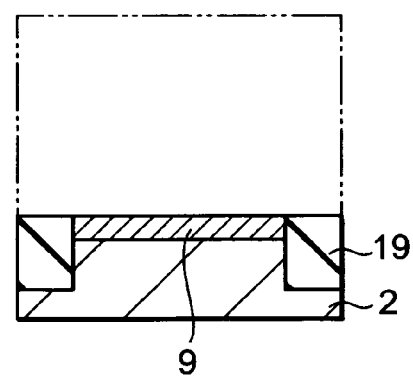
FIG. 28C is a cross-sectional view illustrating the seventh step of the manufacturing for a cross-section along C-C' of FIG. 28A.
Figure 28D:
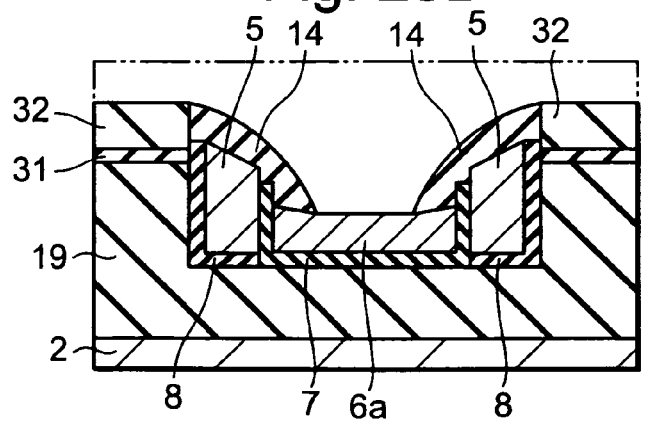
FIG. 28D is a cross-sectional view illustrating the seventh step of the manufacturing for a cross-section along D-D' of FIG. 28A.
Figure 28E:
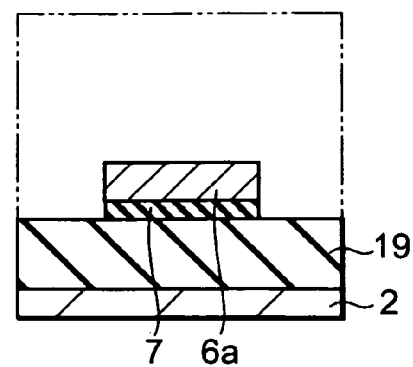
FIG. 28E is a cross-sectional view illustrating the seventh step of the manufacturing for a cross-section along E-E' of FIG. 28A.

FIGS. 28A to 28E are diagrams exemplifying a state of a seventh process for manufacturing the memory element 1 according to the second exemplary embodiment. FIG. 28A is a plan view of a semiconductor material of the seventh process, which is viewed from above. FIG. 28B is a cross-sectional view exemplifying the configuration of a cross section B-B'. FIG. 28C is a cross-sectional view exemplifying the configuration of a cross section C-C'. FIG. 28D is a cross-sectional view exemplifying the configuration of a cross section D-D'. FIG. 28E is a cross-sectional view exemplifying the configuration of a cross section E-E'.

As shown in FIGS. 28B and 28D, in the seventh process, after an oxide film (not shown) that entirely covers the semiconductor material has been formed, the oxide film is etched back to symmetrically form the cell side walls 14. As shown in FIG. 28B, in the B-B' cross section, in the seventh process, the side surface and upper surface of the memory gate 6, and the upper surface of the control gate 5 are covered with the cell side walls 14. The cell side walls 14 are so formed as to face each other in the B-B' cross section. As shown in FIG. 28C, the C-C' cross section corresponds to the opening portion between the opposite cell side walls 14 to expose the element isolation region 19 and the LDD region 9 therebetween.

As shown in FIG. 28D, in the seventh process, in the D-D' cross section, parts of the memory gate contact region 6a and the upper surface of the control gate 5 are covered with the cell side walls 14. The cell side walls 14 are so configured as to face each other. As shown in FIG. 28E, in the seventh process, the upper surface of the memory gate contact region 6a is exposed after being temporarily coated with an oxide film not shown in the E-E' cross section.

Figure 29A:
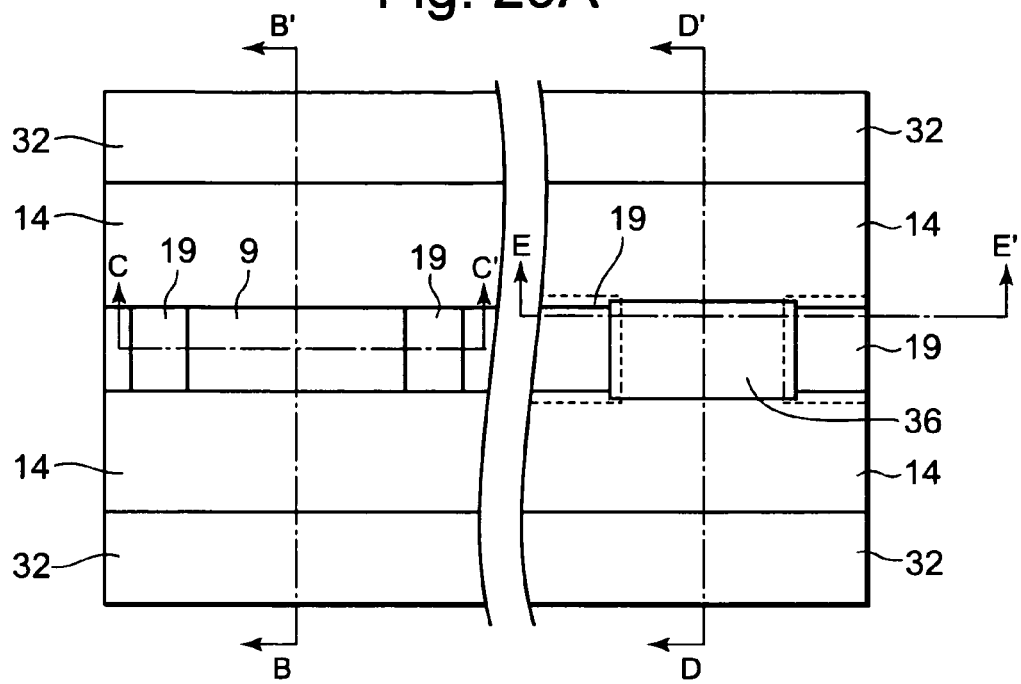
FIG. 29A is a plan view illustrating an eighth step of a manufacturing for the semiconductor device 10 according to the second exemplary embodiment.
Figure 29B:
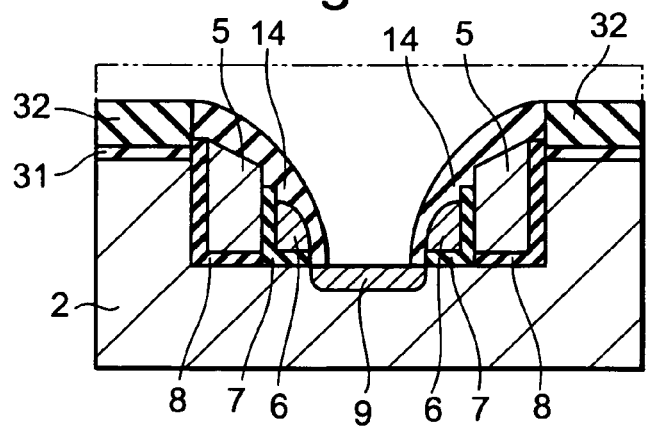
FIG. 29B is a cross-sectional view illustrating the eighth step of the manufacturing for a cross-section along B-B' of FIG. 29A.
Figure 29C:
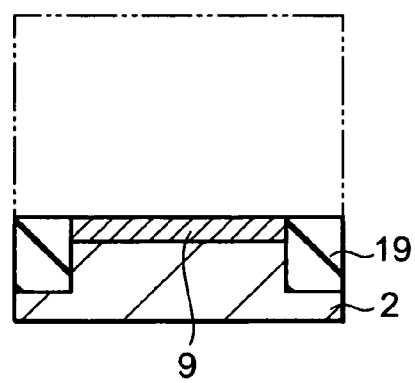
FIG. 29C is a cross-sectional view illustrating the eighth step of the manufacturing for a cross-section along C-C' of FIG. 29A.
Figure 29D:
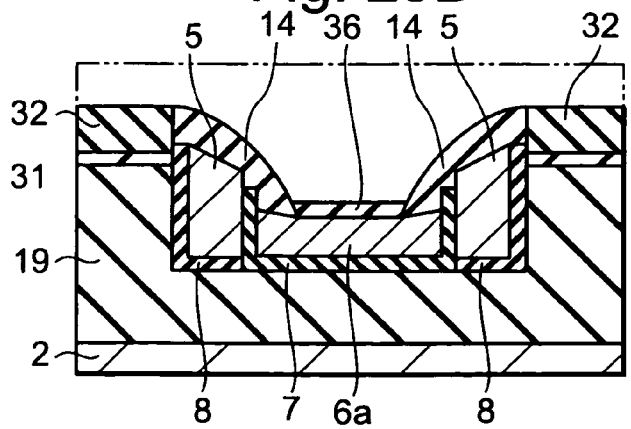
FIG. 29D is a cross-sectional view illustrating the eighth step of the manufacturing for a cross-section along D-D' of FIG. 29A.
Figure 29E:
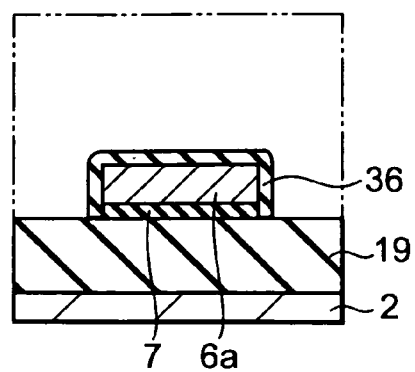
FIG. 29E is a cross-sectional view illustrating the eighth step of the manufacturing for a cross-section along E-E' of FIG. 29A.

FIGS. 29A to 29E are diagrams exemplifying a state of an eighth process for manufacturing the memory element 1 according to the second exemplary embodiment. FIG. 29A is a plan view of a semiconductor material of the eighth process, which is viewed from above. FIG. 29B is a cross-sectional view exemplifying the configuration of a cross section B-B'. FIG. 29C is a cross-sectional view exemplifying the configuration of a cross section C-C'. FIG. 29D is a cross-sectional view exemplifying the configuration of a cross section D-D'. FIG. 29E is a cross-sectional view exemplifying the configuration of a cross section E-E'.

In the eighth process, a second protective oxide film 36 that covers the memory gate contact region 6a between the opposite cell side walls 14 is formed in the contact region. As shown in FIG. 29B, in the eighth process, in the B-B' cross section, the upper surface of the control gate 5, and the surface of the semiconductor substrate 2 outside of the trench outside of the control gate 5 are exposed. As shown in FIG. 29C, in the C-C' cross section, the surface of the LDD region 9 is exposed. As shown in FIG. 29E, in the eighth process, in the E-E' cross section, a second protective oxide film 36 that covers the surface and side surface of the memory gate contact region 6a is formed. Also, the second protective oxide film 36 covers the side surface of the charge storage layer 7 formed below the memory gate contact region 6a.

Figure 30A:
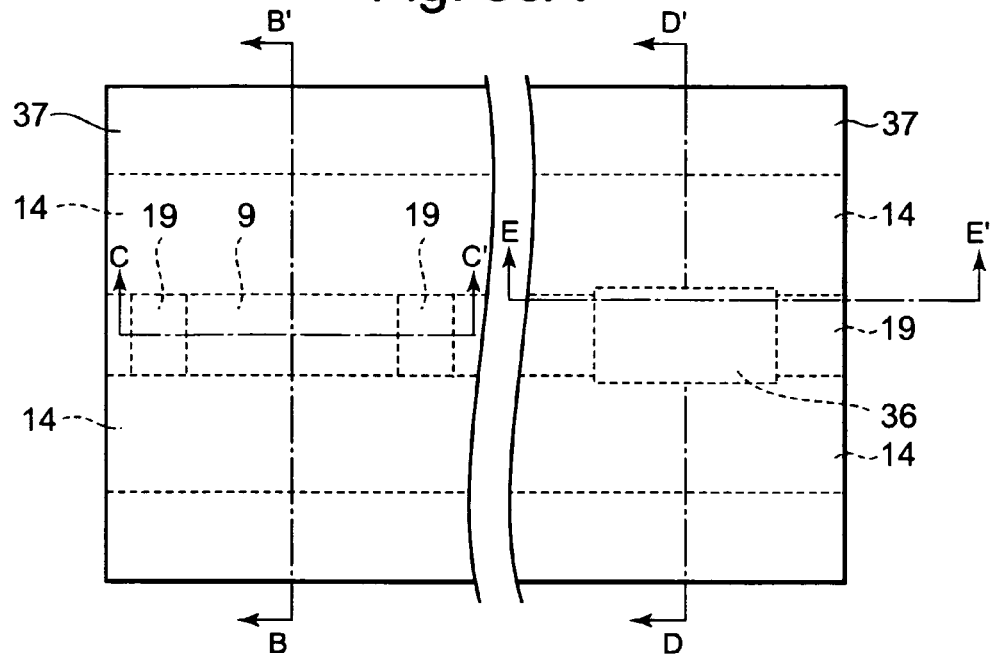
FIG. 30A is a plan view illustrating a ninth step of a manufacturing for the semiconductor device 10 according to the second exemplary embodiment.
Figure 30B:
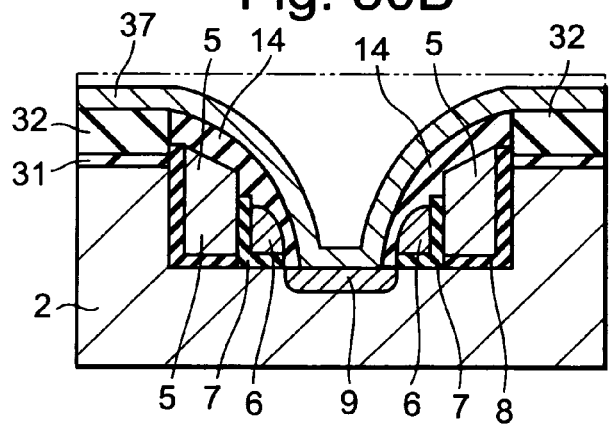
FIG. 30B is a cross-sectional view illustrating the ninth step of the manufacturing for a cross-section along B-B' of FIG. 30A.
Figure 30C:
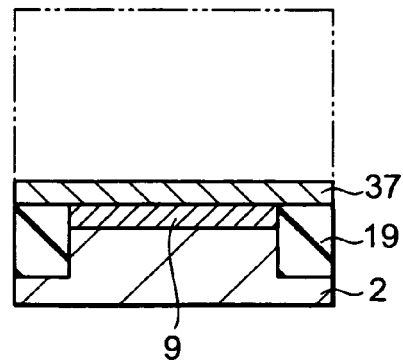
FIG. 30C is a cross-sectional view illustrating the ninth step of the manufacturing for a cross-section along C-C' of FIG. 30A.
Figure 30D:
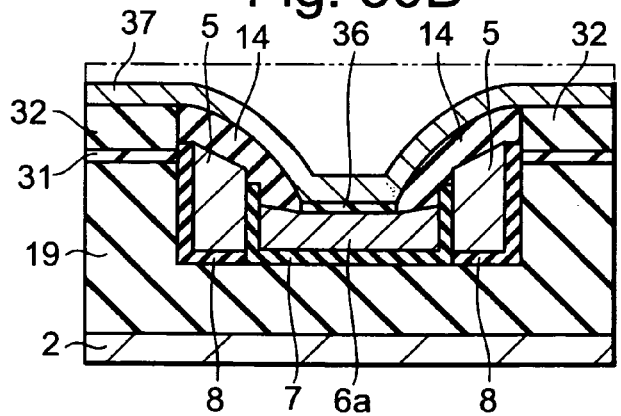
FIG. 30D is a cross-sectional view illustrating the ninth step of the manufacturing for a cross-section along D-D' of FIG. 30A.
Figure 30E:
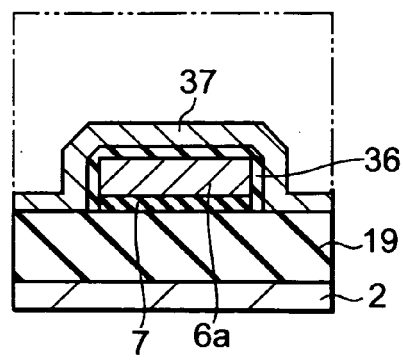
FIG. 30E is a cross-sectional view illustrating the ninth step of the manufacturing for a cross-section along E-E' of FIG. 30A.

FIGS. 30A to 30E are diagrams exemplifying a state of a ninth process for manufacturing the memory element 1 according to the second exemplary embodiment. FIG. 30A is a plan view of a semiconductor material of the ninth process, which is viewed from above. FIG. 30B is a cross-sectional view exemplifying the configuration of a cross section B-B'. FIG. 30C is a cross-sectional view exemplifying the configuration of a cross section C-C'. FIG. 30D is a cross-sectional view exemplifying the configuration of a cross section D-D'. FIG. 30E is a cross-sectional view exemplifying the configuration of a cross section E-E'.

As shown in FIGS. 30B and 30C, in the ninth process, a polysilicon film 37 that entirely covers the semiconductor material is formed. The polysilicon film 37 covers the exposed LDD region 9. When the semiconductor device 10 has a logic portion, the manufacturing process of a circuit element (for example, web formation to gate formation to extension formation) in the region (not shown) where the logic portion, is formed is conducted while protecting the memory element region. Thereafter, the oxide film and the polysilicon film which have been also formed in the memory element region in the formation of the logic portion are removed.

Figure 31A:
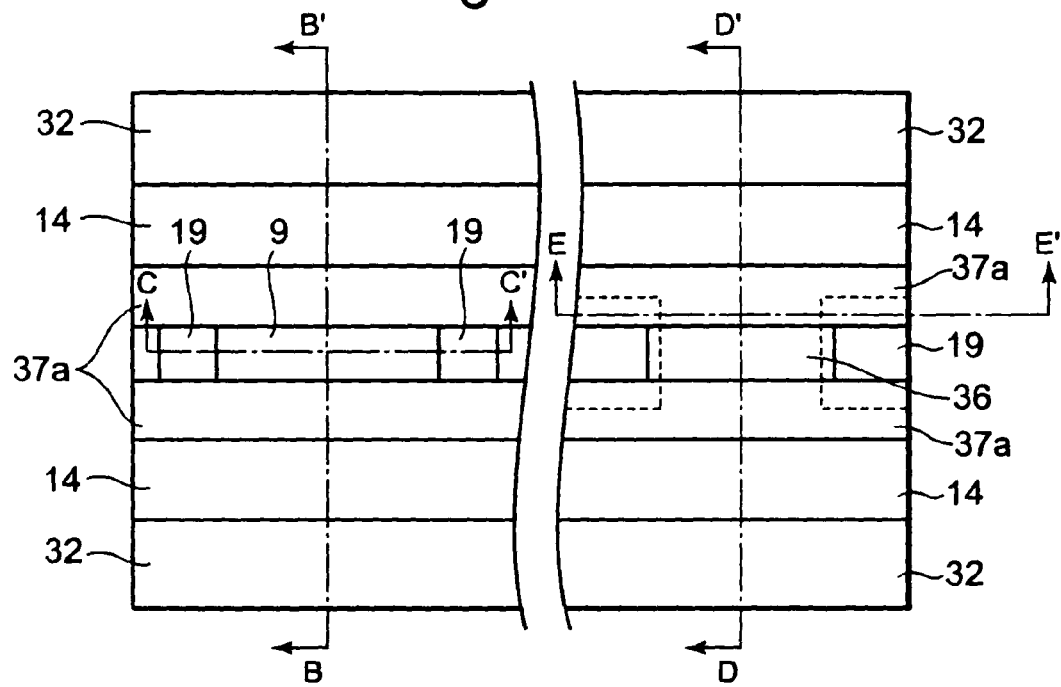
FIG. 31A is a plan view illustrating a tenth step of a manufacturing for the semiconductor device 10 according to the second exemplary embodiment.
Figure 31B:
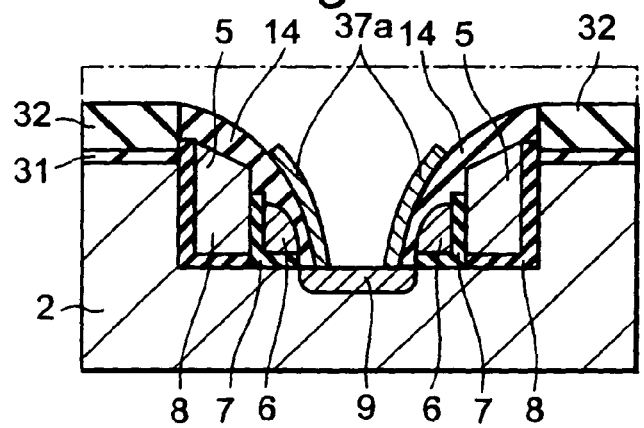
FIG. 31B is a cross-sectional view illustrating the tenth step of the manufacturing for a cross-section along B-B' of FIG. 31A.
Figure 31C:
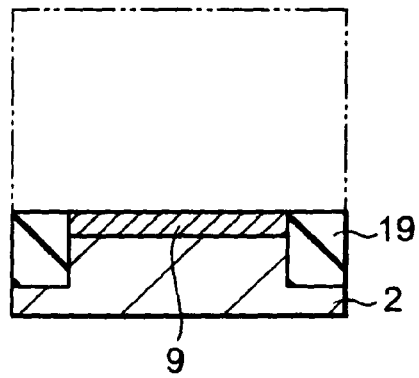
FIG. 31C is a cross-sectional view illustrating the tenth step of the manufacturing for a cross-section along C-C' of FIG. 31A.
Figure 31D:
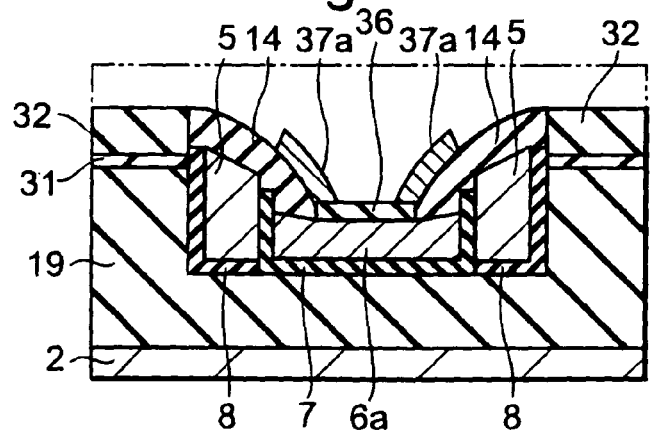
FIG. 31D is a cross-sectional view illustrating the tenth step of the manufacturing for a cross-section along D-D' of FIG. 31A.
Figure 31E:
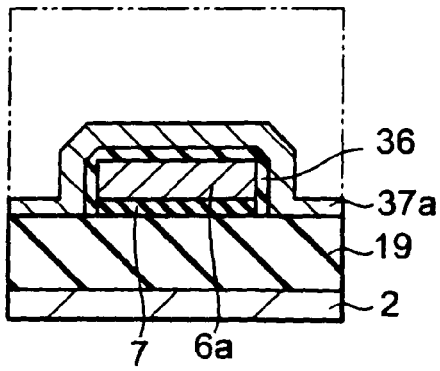
FIG. 31E is a cross-sectional view illustrating the tenth step of the manufacturing for a cross-section along E-E' of FIG. 31A.

FIGS. 31A to 31E are diagrams exemplifying a state of a tenth process for manufacturing the memory element 1 according to the second exemplary embodiment. FIG. 31A is a plan view of a semiconductor material of the tenth process, which is viewed from above. FIG. 31B is a cross-sectional view exemplifying the configuration of a cross section B-B'. FIG. 31C is a cross-sectional view exemplifying the configuration of a cross section C-C'. FIG. 31D is a cross-sectional view exemplifying the configuration of a cross section D-D'. FIG. 31E is a cross-sectional view exemplifying the configuration of a cross section E-E'.

In the tenth process, the polysilicon film 37 that is formed on the entire surface is etched back to form a polysilicon side wall 37a. As shown in FIG. 31B, in the B-B' cross section, the polysilicon side wall 37a is so configured as to cover the side surface and the upper surface of the memory gate 6. Also, the surface of the LDD region 9 is exposed between the polysilicon side walls 37a. As shown in FIG. 31C, in the C-C' cross section, the LDD region 9 between the element isolation regions 19 is exposed. As shown in FIG. 31D, the polysilicon film 37 formed on the entire surface is etched back to form the polysilicon side wall 37a. In the D-D' cross section, the polysilicon side wall 37a is configured to face each other, the surface of the second protective oxide film 36 between the two polysilicon side wall 37 is exposed. As shown in FIG. 31E, in the E-E' cross section, the polysilicon side wall 37a covers the second protective oxide film 36 on the memory gate contact region 6a.

Figure 32A:
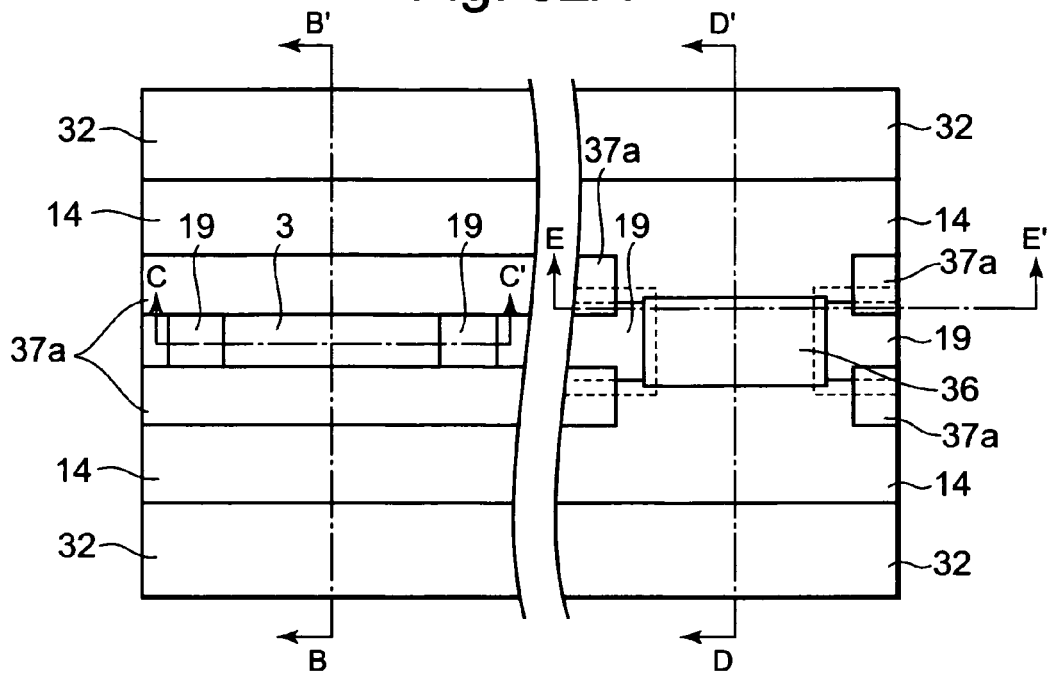
FIG. 32A is a plan view illustrating an eleventh step of a manufacturing for the semiconductor device 10 according to the second exemplary embodiment.
Figure 32B:
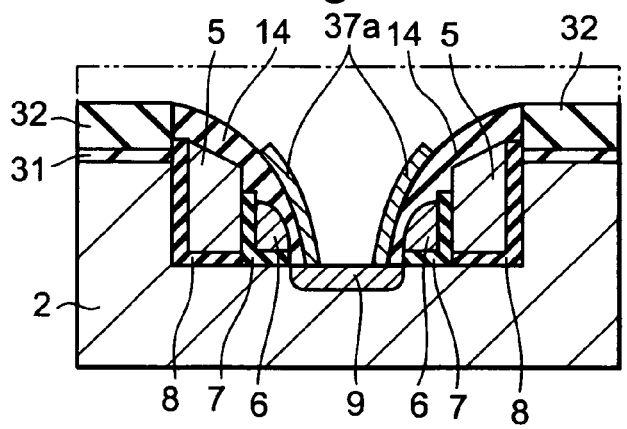
FIG. 32B is a cross-sectional view illustrating the eleventh step of the manufacturing for a cross-section along B-B' of FIG. 32A.
Figure 32C:
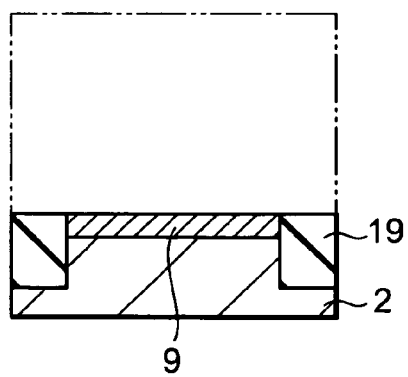
FIG. 32C is a cross-sectional view illustrating the eleventh step of the manufacturing for a cross-section along C-C' of FIG. 32A.
Figure 32D:
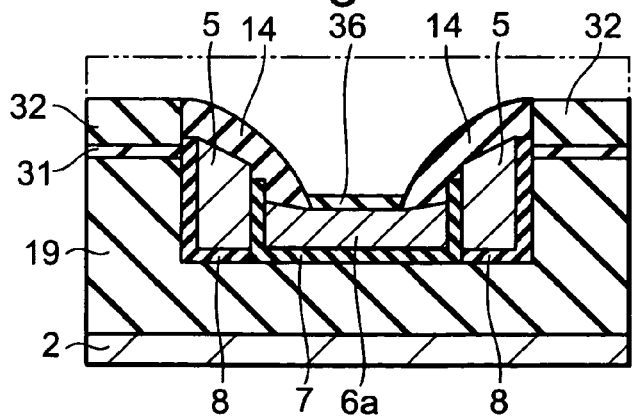
FIG. 32D is a cross-sectional view illustrating the eleventh step of the manufacturing for a cross-section along D-D' of FIG. 32A.
Figure 32E:
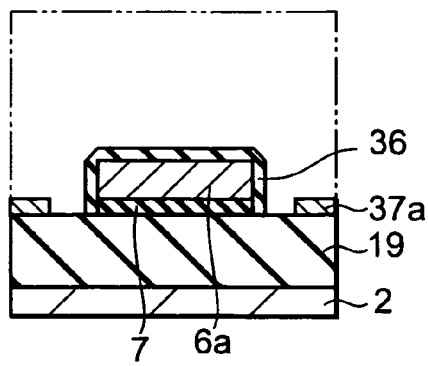
FIG. 32E is a cross-sectional view illustrating the eleventh step of the manufacturing for a cross-section along E-E' of FIG. 32A.

FIGS. 32A to 32E are diagrams exemplifying a state of an eleventh process for manufacturing the memory element 1 according to the second exemplary embodiment. FIG. 32A is a plan view of a semiconductor material of the eleventh process, which is viewed from above. FIG. 32B is a cross-sectional view exemplifying the configuration of a cross section B-B'. FIG. 32C is a cross-sectional view exemplifying the configuration of a cross section C-C'. FIG. 32D is a cross-sectional view exemplifying the configuration of a cross section D-D'. FIG. 32E is a cross-sectional view exemplifying the configuration of a cross section E-E'.

In the eleventh process, the polysilicon side wall 37a of the contact region is removed by using a resist mask (not shown). As shown in FIGS. 32B and 32C, the polysilicon side wall 37a in the memory element region maintains the same state as that in the eighth process. As shown in FIG. 32D, in the contact region, in the D-D' cross section, the polysilicon side wall 37a is removed. As shown in FIG. 32E, in the E-E' cross section, the polysilicon side wall 37a that covers the second protective oxide film 36 is removed. In this situation, the polysilicon side wall 37a formed on the side of the memory gate contact region 6a is protected by a resist mask. After removal of the polysilicon side wall 37a in the contact region, the resist mask is removed.

FIGS. 33A to 33E are diagrams exemplifying a state of a twelfth process for manufacturing the memory element 1 according to the second exemplary embodiment. FIG. 33A is a plan view of a semiconductor material of the twelfth process, which is viewed from above. FIG. 33B is a cross-sectional view exemplifying the configuration of a cross section B-B'. FIG. 33C is a cross-sectional view exemplifying the configuration of a cross section C-C'. FIG. 33D is a cross-sectional view exemplifying the configuration of a cross section D-D'. FIG. 33E is a cross-sectional view exemplifying the configuration of a cross section E-E'.

In the twelfth process, the surface of the LDD region 9 and the surface of the polysilicon side wall 37a are protected by the oxide film (not shown) to remove the nitride film 32. Thereafter, the oxide film and the cell side wall 14 on the control gate 5 are removed. In this situation, the element isolation region 19 between the adjacent LDD regions 9 may be frequently lowered. Referring to FIG. 33A, in the second exemplary embodiment, the LDD regions 9 of the adjacent memory elements 1 are connected by the polysilicon side wall 37a. The polysilicon side wall 37a becomes the first diffusion layer silicide 11 in the subsequent process, and the first source/drain diffusion layers 3 of the adjacent memory elements 1 are electrically connected to each other. For that reason, the memory element 1 can be configured without being affected by the height of the element isolation region 19.

As shown in FIG. 33B, in the twelfth process, in the B-B' cross section, the upper surface of the control gate 5 and the surface of the semiconductor substrate 2 outside of the control gate 5 are exposed. As shown in FIG. 33C, in the C-C' cross section, the surface of the LDD region 9 which has been temporarily covered with the oxide film (not shown) is exposed. As shown in FIG. 33D, in the D-D' cross section, the upper surface of the control gate 5, parts of the surface of the memory gate contact region 6a, and the surface of the element isolation region 19 outside of the control gate 5 are exposed. As shown in FIG. 33E, in the twelfth process, in the E-E' cross section, the cell side wall 14 is formed in the shape of the side wall on the side surface of the memory gate contact region 6a.

Figure 34A:
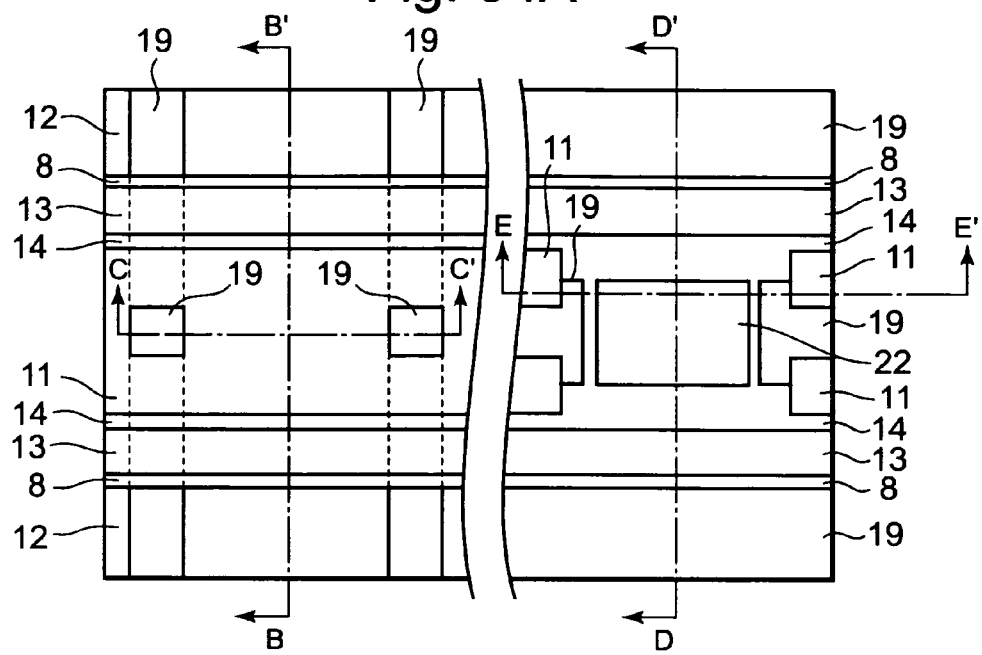
FIG. 34A is a plan view illustrating a thirteenth step of a manufacturing for the semiconductor device 10 according to the second exemplary embodiment.
Figure 34B:
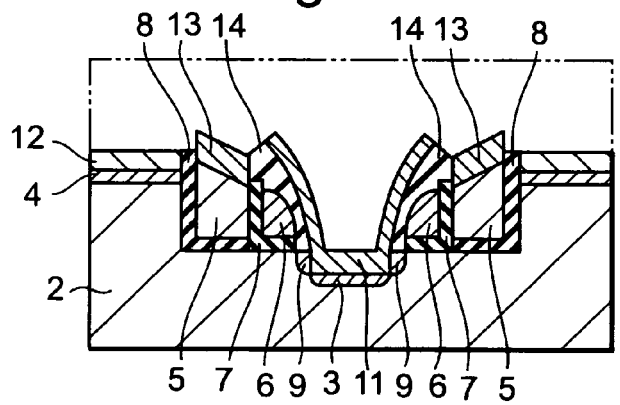
Figure 34C:
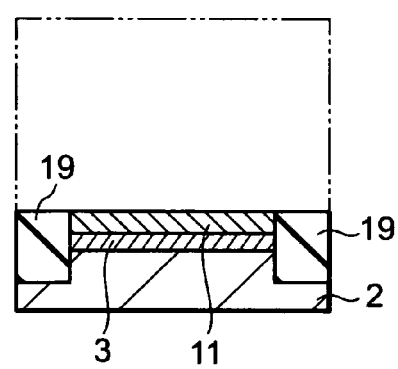
Figure 34D:
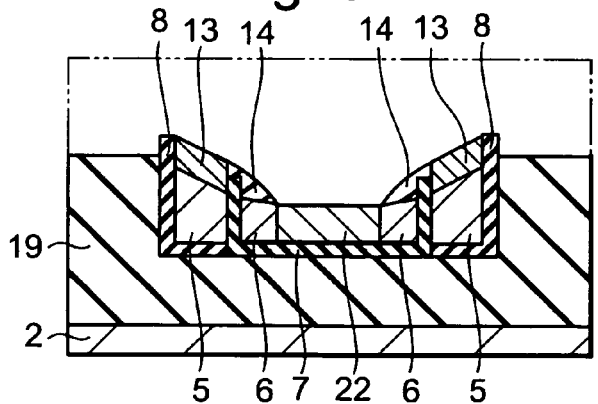
Figure 34E:
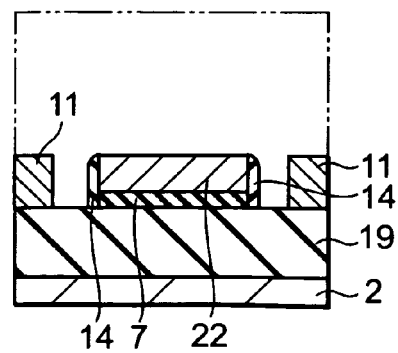

FIGS. 34A to 34E are diagrams exemplifying a state of a thirteenth process for manufacturing the memory element 1 according to the second exemplary embodiment. FIG. 34A is a plan view of a semiconductor material of the thirteenth process, which is viewed from above. FIG. 34B is a cross-sectional view exemplifying the configuration of a cross section B-B'. FIG. 34C is a cross-sectional view exemplifying the configuration of a cross section C-C'. FIG. 34D is a cross-sectional view exemplifying the configuration of a cross section D-D'. FIG. 34E is a cross-sectional view exemplifying the configuration of a cross section E-E'.

As shown in FIGS. 34B and 34C, in the thirteenth process, the memory gate 6 or the control gate 5 serves as a mask, and impurities (for example, As of $2E15/cm^2$) for forming the first source/drain diffusion layer 3 and the second source/drain diffusion layer 4 are implanted. Thereafter, the polysilicon side walls 37a and the first source/drain diffusion layer 3 therebetween are silicided to form the first diffusion layer silicide 11. In this situation, at the same time, the second diffusion layer silicide 12 and the control gate silicide 13 are formed. As shown in FIGS. 34D and 34E, in the thirteenth process, in the contact process, the memory gate silicide 22 is formed.

Thereafter, after formation of the side wall 15, the interlayer insulating film 18 (not shown) is formed to constitute a contact hole (not shown) for forming the first source/drain contact 16 and the second source/drain contact 17.

Although the invention has been described above in connection with several exemplary embodiments thereof, it will be appreciated by those skilled in the art that those exemplary embodiments is provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A nonvolatile semiconductor memory device, comprising:
    a semiconductor substrate that includes a trench;
    a charge storage layer that is formed inside of the trench;
    a first gate that is formed above a side surface and a bottom surface of the trench;
    a second gate that is formed beside the first gate, and that is formed above the charge storage layer;
    a first diffusion region that is formed on the semiconductor substrate inside of the trench; and
    a second diffusion region that is formed on the semiconductor substrate outside of the trench,
    wherein, in a cross sectional view, an entirety of a region of a top surface of the first gate is silicided.

2. The nonvolatile semiconductor memory device according to claim 1, wherein the first gate is adjacent to the second gate.

3. The nonvolatile semiconductor memory device according to claim 1, wherein the semiconductor substrate comprises:
    a channel region along the side surface and the bottom surface of the trench.

4. The nonvolatile semiconductor memory device according to claim 3, wherein the channel region comprises:
    a first channel region corresponding to a lower portion of the second gate;
    a second channel region corresponding to a lower portion of the first gate; and
    a third channel region corresponding to a side portion of the first gate.

5. The nonvolatile semiconductor memory device according to claim 1, wherein the first diffusion region is located at a position deeper than the second diffusion region.

6. The nonvolatile semiconductor memory device according to claim 1, wherein the first diffusion region is formed at a position corresponding to an area beside the second gate.

7. The nonvolatile semiconductor memory device according to claim 1, wherein the second gate is formed as a side wall of the first gate through an insulating layer, and includes a surface having a curved shape.

8. The nonvolatile semiconductor memory device according to claim 1, further comprising:
    an insulating layer that is formed above the second gate;
    a silicide layer that is formed above the insulating layer; and
    an interlayer insulating film that is formed above the silicide layer.

9. The nonvolatile semiconductor memory device according to claim 1, wherein the region of the top surface of the first gate comprises a silicide control gate that abuts the top surface of the first gate.

10. The nonvolatile semiconductor memory device according to claim 1, wherein the region of the top surface of the first gate comprises a silicide control gate that abuts the charge storage layer.

11. The nonvolatile semiconductor memory device according to claim 1, wherein the second diffusion region abuts the charge storage layer.

12. The nonvolatile semiconductor memory device according to claim 1, further comprising:
    an insulating layer disposed on an upper surface of the second gate,
    wherein the region of the top surface of the first gate comprises a silicide control gate that abuts the insulating layer.

13. The nonvolatile semiconductor memory device according to claim 1, wherein an entirety of the top surface of the first gate is silicided.

* * * * *